US010796657B1

(12) United States Patent
Liu et al.

(10) Patent No.: US 10,796,657 B1
(45) Date of Patent: Oct. 6, 2020

(54) CONVERSION CIRCUIT, DISPLAY PANEL AND DISPLAY DEVICE

(71) Applicant: WuHan TianMa Micro-electronics CO., LTD, Wuhan (CN)

(72) Inventors: Chuan Liu, Wuhan (CN); Junjie Fu, Wuhan (CN); Zhihua Yu, Wuhan (CN); Tianlong Xiang, Wuhan (CN)

(73) Assignee: WuHan TianMa Micro-electronics CO., LTD, Wuhan (CN)

( * ) Notice: Subject to any disclaimer, the term of this patent is extended or adjusted under 35 U.S.C. 154(b) by 0 days.

(21) Appl. No.: 16/673,598

(22) Filed: Nov. 4, 2019

(30) Foreign Application Priority Data

Jun. 28, 2019 (CN) .......................... 2019 1 0579261

(51) Int. Cl.
*G09G 3/36* (2006.01)
*G06F 1/04* (2006.01)
*H03K 3/353* (2006.01)

(52) U.S. Cl.
CPC ............. *G09G 3/3677* (2013.01); *G06F 1/04* (2013.01); *H03K 3/353* (2013.01); *G09G 2310/0286* (2013.01); *G09G 2310/08* (2013.01)

(58) Field of Classification Search
CPC ............... G09G 3/3614; G09G 3/3677; G09G 2310/0264; G09G 2310/0267; G09G 2310/027; G09G 2310/0272; G09G 2310/0275; G09G 2310/0278; G09G 2310/0286; G09G 2310/08; G06F 1/04; H03K 3/353

See application file for complete search history.

(56) References Cited

U.S. PATENT DOCUMENTS

| 4,734,692 A * | 3/1988 | Hosono | G09G 3/3614 345/96 |
| 7,126,596 B1 * | 10/2006 | Hogan | G09G 3/3688 345/211 |
| 8,823,687 B2 * | 9/2014 | Kitamura | G09G 3/3614 345/204 |
| 2009/0267932 A1 * | 10/2009 | Lin | G09G 3/3614 345/212 |

(Continued)

FOREIGN PATENT DOCUMENTS

| CN | 104810004 A | 7/2015 |
| CN | 105870131 A | 8/2016 |

*Primary Examiner* — Tom V Sheng
(74) *Attorney, Agent, or Firm* — Christensen O'Connor Johnson Kindness PLLC

(57) ABSTRACT

Provided is a conversion circuit, including a switch signal input terminal; first and second input terminals; and first and second output terminals. The switch signal input terminal receives a switch control signal. The first and second input terminals receive first and second input signals, and polarities of first and second input signals are different and alternately switch. Depending on the switch control signal, the first input terminal is in communication with the first output terminal and the second input terminal is in communication with the second output terminal, or the second input terminal is in communication with the first output terminal and the first input terminal is in communication with the second output terminal, so that a first output signal outputted from first output terminal has a consistent polarity at any time and a second output signal outputted from the second output terminal has a consistent polarity at any time.

16 Claims, 30 Drawing Sheets

(56) References Cited

U.S. PATENT DOCUMENTS

| | | | |
|---|---|---|---|
| 2013/0241910 A1* | 9/2013 | Huang | G09G 3/3696 345/211 |
| 2016/0063915 A1* | 3/2016 | Kim | G09G 3/3685 345/209 |
| 2018/0006638 A1* | 1/2018 | Chen | H03K 17/04126 |

* cited by examiner

US 10,796,657 B1

CONVERSION CIRCUIT, DISPLAY PANEL AND DISPLAY DEVICE

CROSS-REFERENCE TO RELATED APPLICATIONS

The present disclosure claims priority to Chinese Patent Application No. 201910579261.6, filed on Jun. 28, 2019, the content of which is incorporated herein by reference in its entirety.

TECHNICAL FIELD

The present disclosure relates to the technical field of display panel technologies, and in particular, to a conversion circuit, a display panel and a display device.

BACKGROUND

A conventional display panel (a flexible display panel or a liquid crystal display panel) is usually driven by a COF (Chip On Film), and a driving circuit (or a driving chip) on the COF is used to output a driving signal to a VSR (vertical shift register) circuit of the display panel so as to drive the display panel to work. However, since the driving circuit on the COF has two adjacent signal lines that have driving voltages with opposite polarities and a large voltage difference, an electric field is formed between the two adjacent signal lines when a constant voltage difference is kept between the two signal lines. As a result, metal wires on the COF will be electrochemically dissociated and migrate along a direction of the electric field. After operation for a long time in such a state, dissociated metal ions would lead two signal lines to overlap, thereby resulting in a short circuit.

SUMMARY

In view of this, an embodiment of the present disclosure provides a conversion circuit, a display panel, and a display device, which are used to solve a problem in the related art that two adjacent signal lines of the driving circuit on the COF constantly output signals with opposite polarities, thereby causing metal of the two signal lines to be electrochemically dissociated to form a short circuit.

In an aspect, an embodiment of the present disclosure provides a conversion circuit, including: at least one switch signal input terminal; a first input terminal; a second input terminal; a first output terminal; and a second output terminal. The at least one switch signal input terminal receives a switch control signal; The first input terminal and the second input terminal respectively receive a first input signal and a second input signal. A polarity of the first input signal and a polarity of the second input signal are different and alternately switch. Depending on the switch control signal, the first input terminal is in communication with the first output terminal and the second input terminal is in communication with the second output terminal; or the second input terminal is in communication with the first output terminal and the first input terminal is in communication with the second output terminal, so that a first output signal outputted from the first output terminal has a consistent polarity at any time and a second output signal outputted from the second output terminal has a consistent polarity at any time.

In another aspect, an embodiment of the present disclosure further provides a display panel, and the display panel has a non-display area provided with the conversion circuit described above.

In still another aspect, an embodiment of the present disclosure provides a display device, including the display panel described above and a flexible circuit board. The display panel is electrically connected to the flexible circuit board. The flexible circuit board is bound with a driving chip, and the driving chip outputs the first input signal to the first input terminal and the second input signal to the second input terminal respectively through adjacent signal lines; the driving chip further outputs a switch control signal to the at least one switch signal input terminal of the conversion circuit.

BRIEF DESCRIPTION OF DRAWINGS

In order to more clearly illustrate technical solutions in embodiments of the present disclosure, the accompanying drawings used in the embodiments are briefly introduced as follows. It should be noted that the drawings described as follows are merely part of the embodiments of the present disclosure, other drawings can also be acquired by those skilled in the art.

DESCRIPTION OF EMBODIMENTS

To illustrate technical solutions of the present disclosure, embodiments of the present disclosure will be described in detail as follows with reference to the accompanying drawings.

It should be noted that, the described embodiments are merely exemplary embodiments of the present disclosure, which shall not be interpreted as providing limitations to the present disclosure. All other embodiments obtained by those skilled in the art according to the embodiments of the present disclosure are within the scope of the present disclosure.

Figure 1:
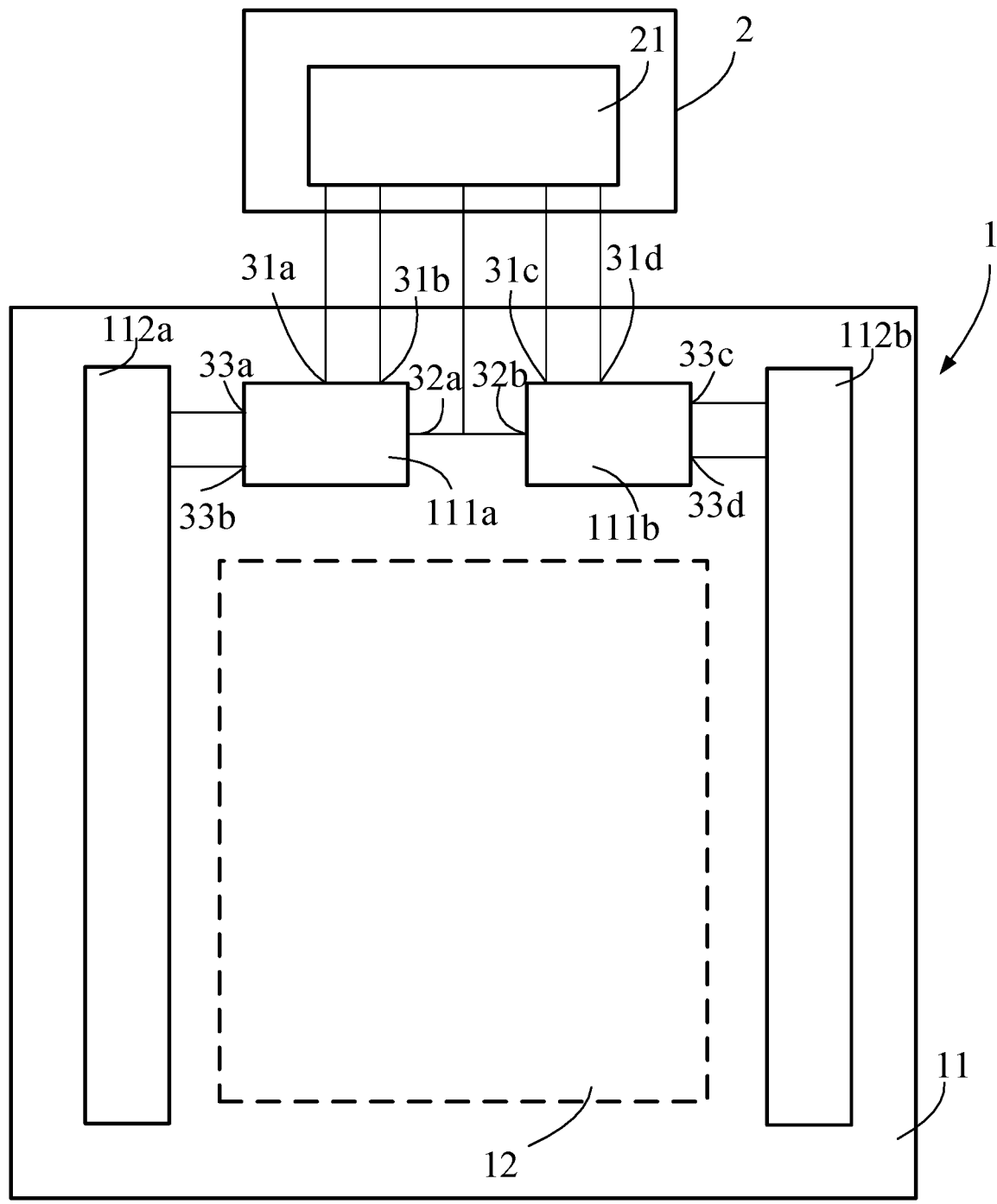
FIG. 1 is a schematic diagram of a structure of a display device according to an embodiment of the present disclosure.

FIG. 1 is a schematic diagram of a structure of a display device according to an embodiment of the present disclosure.

With reference to FIG. 1, the display device includes a display panel 1 and a flexible circuit board 2, and the display panel 1 is electrically connected to the flexible circuit board 2. The display panel 1 has a non-display area 11 and a display area 12. A shift register circuit 112a and a shift register circuit 112b are located in the non-display area 11 and are respectively arranged at a left side and a right side of the display area 12. A driving chip 21 is bound on the flexible circuit board 2, and the driving chip is configured to output a driving signal to the shift register circuit 112a and the shift register circuit 112b on the display panel 11, so as to drive a scanning line circuit and/or a data line circuit within the display area 12 through the shift register circuit 112a and the shift register circuit 112b.

Unlike in the related art, in this embodiment, a conversion circuit 111a and a conversion circuit 111b are further provided in the non-display area 11 of the display panel 1.

The conversion circuit 111a has a first input terminal 31a, a second input terminal 31b, a first output terminal 33a, a second output terminal 33b and a switch signal input terminal 32a. The first input terminal 31a and the second input terminal 31b are configured to receive a first input signal and a second input signal. In this embodiment, the first input signal and the second input signal are respectively outputted from the driving chip 21 through adjacent signal lines. The first output terminal 33a and the second output terminal 33b are respectively connected to the shift register circuit 112a so as to provide a first output signal and a second output signal to the shift register circuit 112a. The switch signal input terminal 32a receives a switch control signal outputted from the driving chip 21.

The conversion circuit 111b has a first input terminal 31c, a second input terminal 31d, a first output terminal 33c, a second output terminal 33d, and a switch signal input terminal 32b. The first input terminal 31c and the second input terminal 31d are configured to receive a first input signal and a second input signal. In this embodiment, the first input signal and the second input signal are respectively outputted from the driving chip 21 through adjacent signal lines. The first output terminal 33c and the second output terminal 33d are respectively connected to the shift register circuit 112b so as to provide a first output signal and a second output signal to the shift register circuit 112b. The switch signal input terminal 32b receives a switch control signal outputted from the driving chip 21.

In this embodiment, the switch signal input terminal of each of the two conversion circuits receives different switch control signals outputted from the driving chip 21, so as to control the first output terminal of the conversion circuit to be in communication with one of the two input terminals and the second output terminal of the conversion circuit to be in communication with the other one of the two input terminals. In this way, in a case where polarities of the first input signal and the second input signal outputted from two adjacent signal lines of the driving chip 21 are different and alternately switch, each of the first output signal and the second output signal has a constant polarity. Since the polarities of the first input signal and the second input signal outputted by the two adjacent signal lines of the driving chip 21 are different and alternately switch, electrochemical dissociation due to constant voltages of the first input terminal and the second input terminal can be reduced, thereby effectively preventing a short circuit between the two signal lines. A circuit structure of the conversion circuit will be described in details in the following embodiments.

The circuit structure of the conversion circuit in the display device described above will be described in the following with reference to the embodiments of the present disclosure. In the following embodiments, the conversion circuit includes four transistors, from left to right in the figures, namely a first transistor, a second transistor, a third transistor and a fourth transistor. The first transistor, the second transistor, the third transistor and the fourth transistor can be all PMOS transistors, or all NMOS transistors, or PMOS transistors and NMOS transistors in different arrangement manners and different circuit connection manners. Further, the switch signal input terminal of the conversion circuit receives different switch control signals to control respective transistors to be turned on or off, so that a polarity of the first input signal and a polarity of the second input signal are different and alternately switch, thereby achieving a constant polarity for each of the first output signal and the second output signal.

Figure 2:
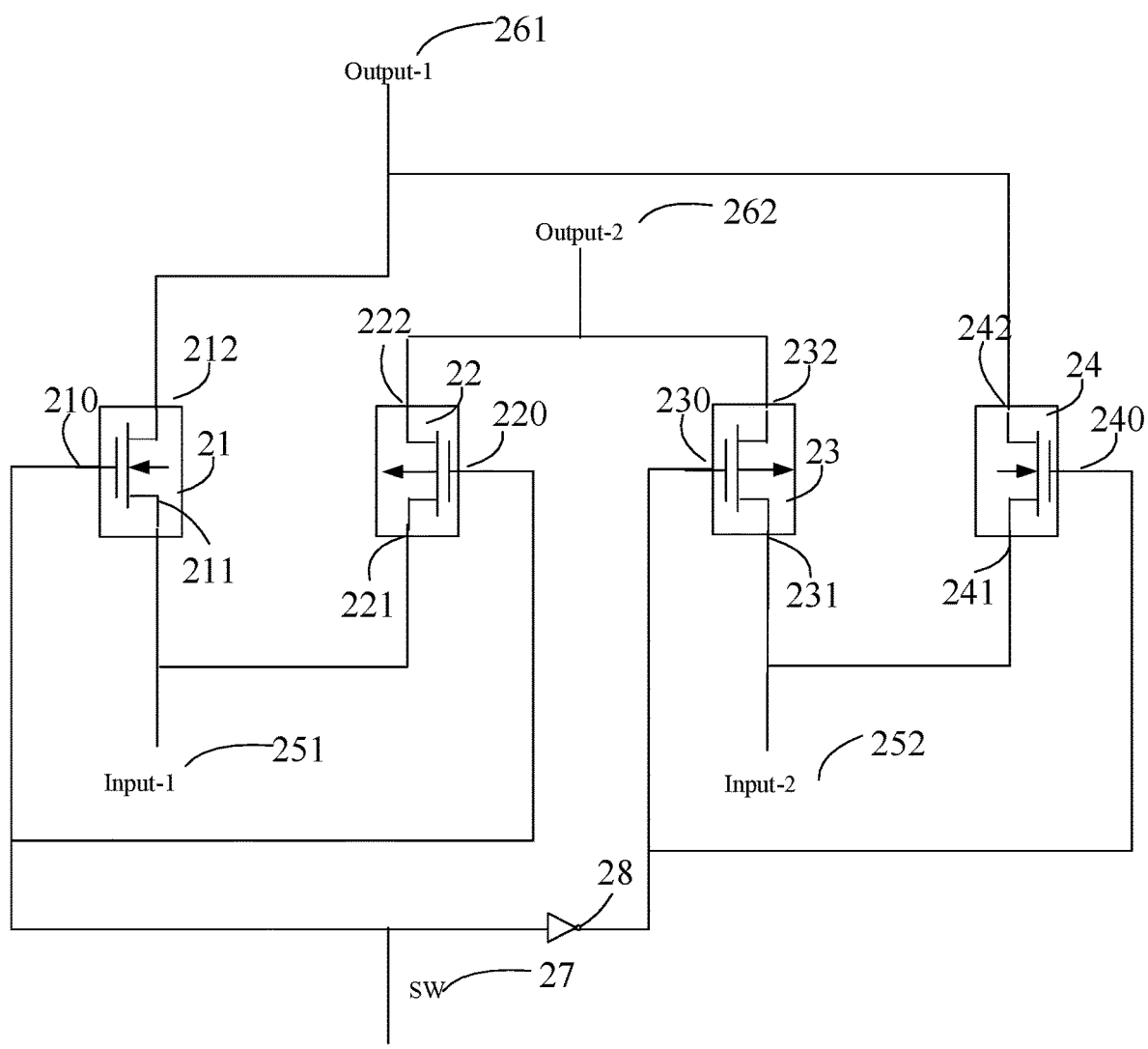
FIG. 2 is a schematic diagram of a structure of a conversion circuit according to an embodiment of the present disclosure.
Figure 3:
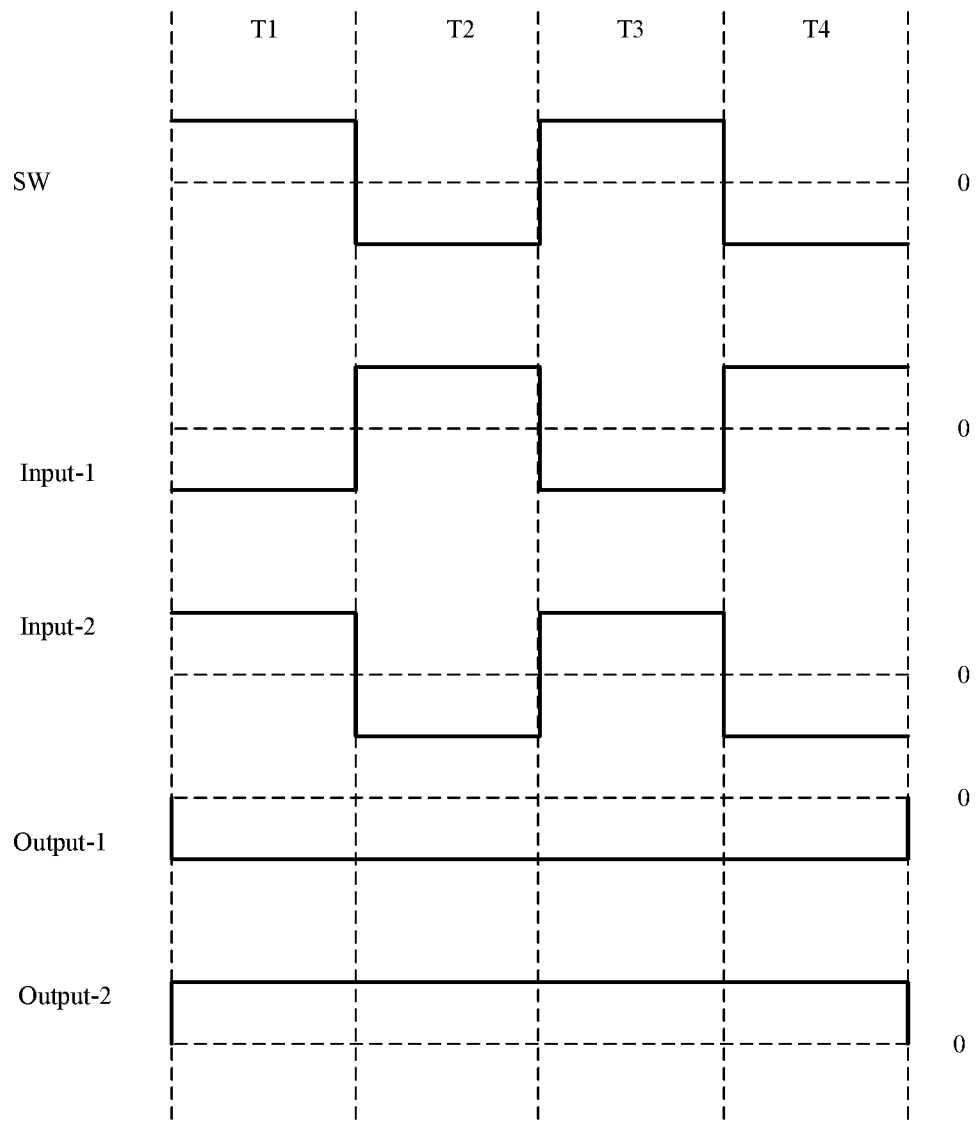
FIG. 3 is a time sequence diagram of an input/output signal at each terminal of the conversion circuit shown in FIG. 2.

FIG. 2 is a schematic diagram of a structure of a conversion circuit according to an embodiment of the present disclosure, and FIG. 3 is a time sequence diagram of an input/output signal at each terminal of the conversion circuit shown in FIG. 2.

With reference to FIG. 2, the first transistor, the second transistor, the third transistor, and the fourth transistor of the conversion circuit are respectively an NMOS transistor 21, a PMOS transistor 22, a PMOS transistor 23, and an NMOS transistor 24.

The first input terminal 251 is connected to a first electrode 211 of the NMOS transistor 21 and a first electrode 221 of the PMOS transistor 22. The second input terminal 252 is connected to a first electrode 231 of the PMOS transistor 23 and a first electrode 241 of the NMOS transistor 24.

The first output terminal 261 is connected to a second electrode 212 of the NMOS transistor 21 and a second electrode 242 of the NMOS transistor 24. The second output terminal 262 is connected to a second electrode 222 of the PMOS transistor 22 and a second electrode 232 of the PMOS transistor 23.

In this embodiment, the conversion circuit further includes a first waveform converter 28. The first waveform converter 28 has a terminal connected to the switch signal input terminal 27, and another terminal connected to a gate electrode 230 of the PMOS transistor 23 and a gate electrode 240 of the NMOS transistor 24. The first waveform converter 28 is configured to invert a level of the switch control signal received from the switch signal input terminal 27 and then transmit it to the gate electrode 230 of the PMOS transistor 23 and the gate electrode 240 of the NMOS transistor 24.

FIG. 3 is a time sequence diagram of the switch signal input terminal 27, the first input terminal 251, the second input terminal 252, the first output terminal 261 and the second output terminal 262 of the conversion circuit shown in FIG. 2.

With reference to FIG. 2 and FIG. 3, during a period T1, the switch control signal received by the switch signal input terminal 27 is a high-level signal. Under control of the high-level signal, the NMOS transistor 21 and the PMOS transistor 23 are turned on, and the PMOS transistor 22 and the NMOS transistor 24 are turned off. In this case, the first input terminal 251 is in communication with the first output terminal 261, and the second input terminal 252 is in communication with the second output terminal 262. Thus, the first output signal outputted from the first output terminal 261 and the first input signal have a same polarity, and the second output signal outputted from the second output terminal 262 and the second input signal have a same polarity. As shown in FIG. 3, during the period T1, the first input signal is a low-level signal and the second input signal is a high-level signal, and thus the first output signal has the same polarity as the first input signal and is a low-level signal, and the second output signal has the same polarity as the second input signal and is a high-level signal.

During a period T2, the switch control signal received by the switch signal input terminal 27 is a low-level signal. Under control of the low-level signal, the NMOS transistor 21 and the PMOS transistor 23 are turned off, and the PMOS transistor 22 and the NMOS transistor 24 are turned on. In this case, the second input terminal 252 is in communication with the first output terminal 261, and the first input terminal 251 is in communication with the second output terminal 262. Thus, the first output signal outputted from the first output terminal 261 and the second input signal have a same polarity, and the second output signal outputted from the second output terminal 262 and the first input signal have a same polarity. As shown in FIG. 3, during the period T2, the first input signal is a high-level signal and the second input signal is a low-level signal, and thus the first output signal has the same polarity as the second input signal and is a low-level signal, and the second output signal has the same polarity as the first input signal and is a high-level signal.

Similarly, waveforms of signals of the switch signal input terminal 27, the first input terminal 251, the second input terminal 252, the first output terminal 261, and the second output terminal 262 during a period T3 are the same as those of during the period T1. Therefore, during the period T3, the first output signal is still a low-level signal, and the second output signal is still a high-level signal.

Waveforms of signals of the switch signal input terminal 27, the first input terminal 251, the second input terminal 252, the first output terminal 261, and the second output terminal 262 during a period T4 are the same as those during the period T2. Therefore, during the period T4, the first output signal is still a low-level signal, and the second output signal is still a high-level signal.

It can be seen that during the periods T1-T4, although polarities of the first input signal and the second input signal received by the first input terminal 251 and the second input terminal 252 are different and alternately switch, each of the first output signal and the second output signal outputted from the first output terminal 261 and the second output terminal 262 has a constant polarity during any period. In this embodiment, the first output signal is always a low-level signal, and the second output signal is always a high-level signal.

Figure 4:
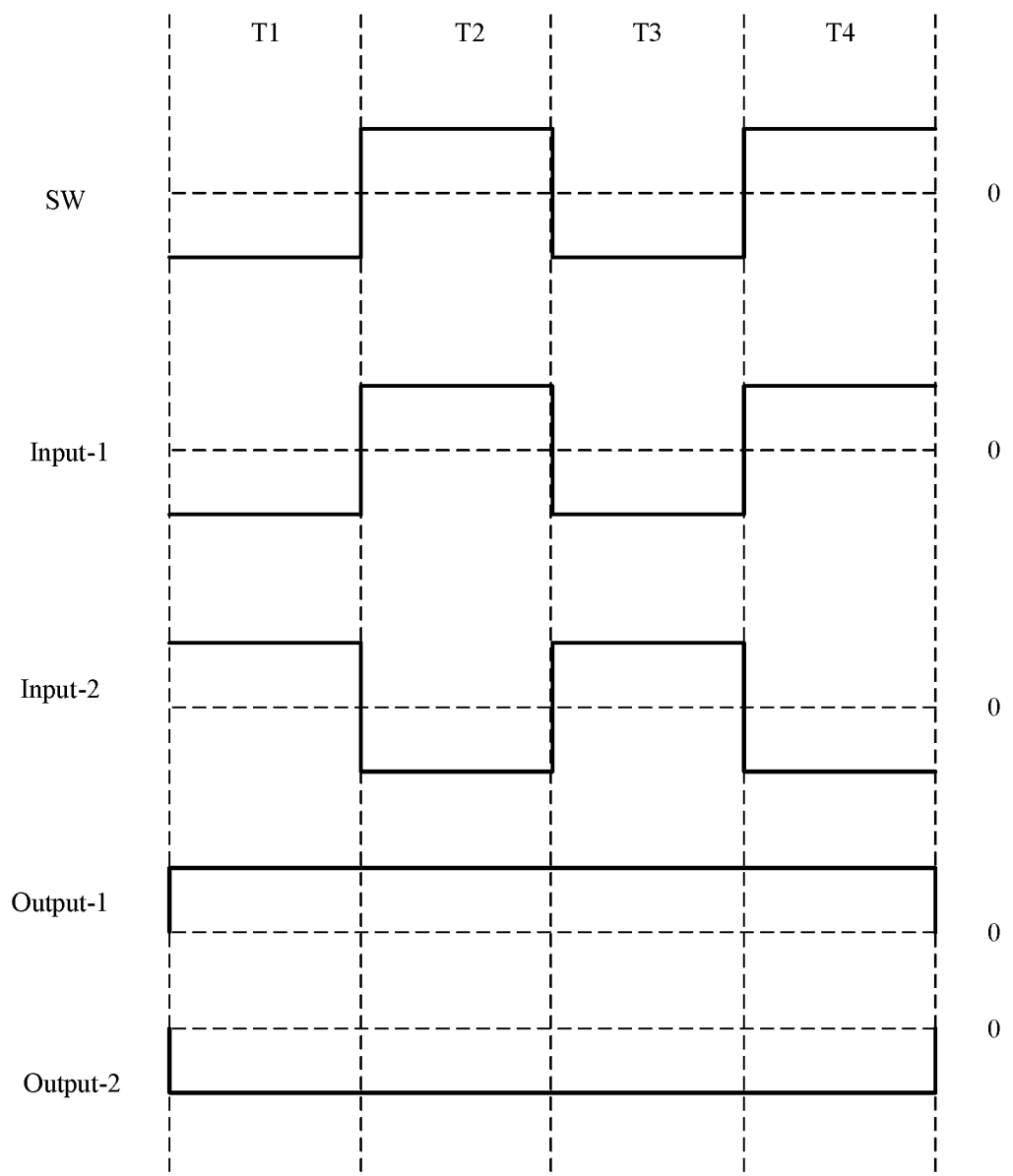
FIG. 4 is another time sequence diagram of an input/output signal at each terminal of the conversion circuit shown in FIG. 2.

FIG. 4 is another time sequence diagram of an input/output signal at each terminal of the conversion circuit shown in FIG. 2.

FIG. 4 differs from the time sequence diagram of the input/output signal shown in FIG. 3 in that the switch control signal received by the switch signal input terminal 27 during the period T1-T4 and the switch control signal received by the switch signal input terminal 27 during the period T1-T4 have opposite polarities.

With reference to FIG. 2 and FIG. 4, during a period T1, the switch control signal received by the switch signal input terminal 27 is a low-level signal. Under control of the low-level signal, the NMOS transistor 21 and the PMOS transistor 23 are turned off, and the PMOS transistor 22 and the NMOS transistor 24 are turned on. In this case, the second input terminal 252 is in communication with the first output terminal 261, and the first input terminal 251 is communication with the second output terminal 262. Thus, the first output signal outputted from the first output terminal 261 and the second input signal have a same polarity, and the second output signal outputted from the second output terminal 262 and the first input signal have a same polarity. As shown in FIG. 4, during the period T1, the first input signal is a low-level signal and the second input signal is a high-level signal, and thus the first output signal has the same polarity as the second input signal and is a high-level signal, and the second output signal has the same polarity as the first input signal and is a low-level signal.

During a period T2, the switch control signal received by the switch signal input terminal 27 is a high-level signal. Under control of the high-level signal, the NMOS transistor 21 and the PMOS transistor 23 are turned on, and the PMOS transistor 22 and the NMOS transistor 24 are turned off. In this case, the first input terminal 251 is in communication with the first output terminal 261, and the second input terminal 252 is in communication with the second output terminal 262. Thus, the first output signal outputted from the first output terminal 261 and the first input signal have a same polarity, and the second output signal outputted from the second output terminal 262 and the second input signal have a same polarity. As shown in FIG. 4, during the period T2, the first input signal is a high-level signal and the second input signal is a low-level signal, and thus the first output signal has the same polarity as the first input signal and is a high-level signal, and the second output signal has the same polarity as the second input signal and is a low-level signal.

Similarly, waveforms of signals of the switch signal input terminal 27, the first input terminal 251, the second input terminal 252, the first output terminal 261, and the second output terminal 262 during a period T3 are the same as those during the period T1. Therefore, during the period T3, the first output signal is a high-level signal, and the second output signal is a low-level signal.

Waveforms of signals of the switch signal input terminal 27, the first input terminal 251, the second input terminal 252, the first output terminal 261, and the second output terminal 262 during a period T4 are the same as those during the period T2. Therefore, during the period T4, the first output signal is a high-level signal, and the second output signal is a low-level signal.

It can be seen that during the periods T1-T4, although polarities of the first input signal and the second input signal received by the first input terminal 251 and the second input terminal 252 are different and alternately switch, each of the first output signal and the second output signal outputted from the first output terminal 261 and the second output terminal 262 has a constant polarity during any period. In this embodiment, the first output signal is always a high-level signal, and the second output signal is always a low-level signal.

In the related art, the PMOS transistor is turned on under a low level (i.e., low level voltage). If a first electrode of the PMOS transistor also receives a low-level signal after being turned on, the PMOS transistor will have a large resistance, which will cause a large voltage drop when current flows through it. Similarly, in the related art, the NMOS transistor is turned on under a high level (i.e., high level voltage). If a first electrode of the NMOS transistor also receives a high-level signal after being turned on, the NMOS transistor will have a large resistance, which will cause a large voltage drop when current flows through it.

Therefore, in order to avoid the resistance problem, when a turn-on level is applied on the NMOS transistor or the PMOS transistor, the first input signal has a polarity opposite to the turn-on level. That is, for the NMOS transistor, the turn-on level is a high level, so the first input signal is a low-level signal; and for the PMOS transistor, the turn-on level is a low level, so the first input signal is a high-level signal.

Figure 5:
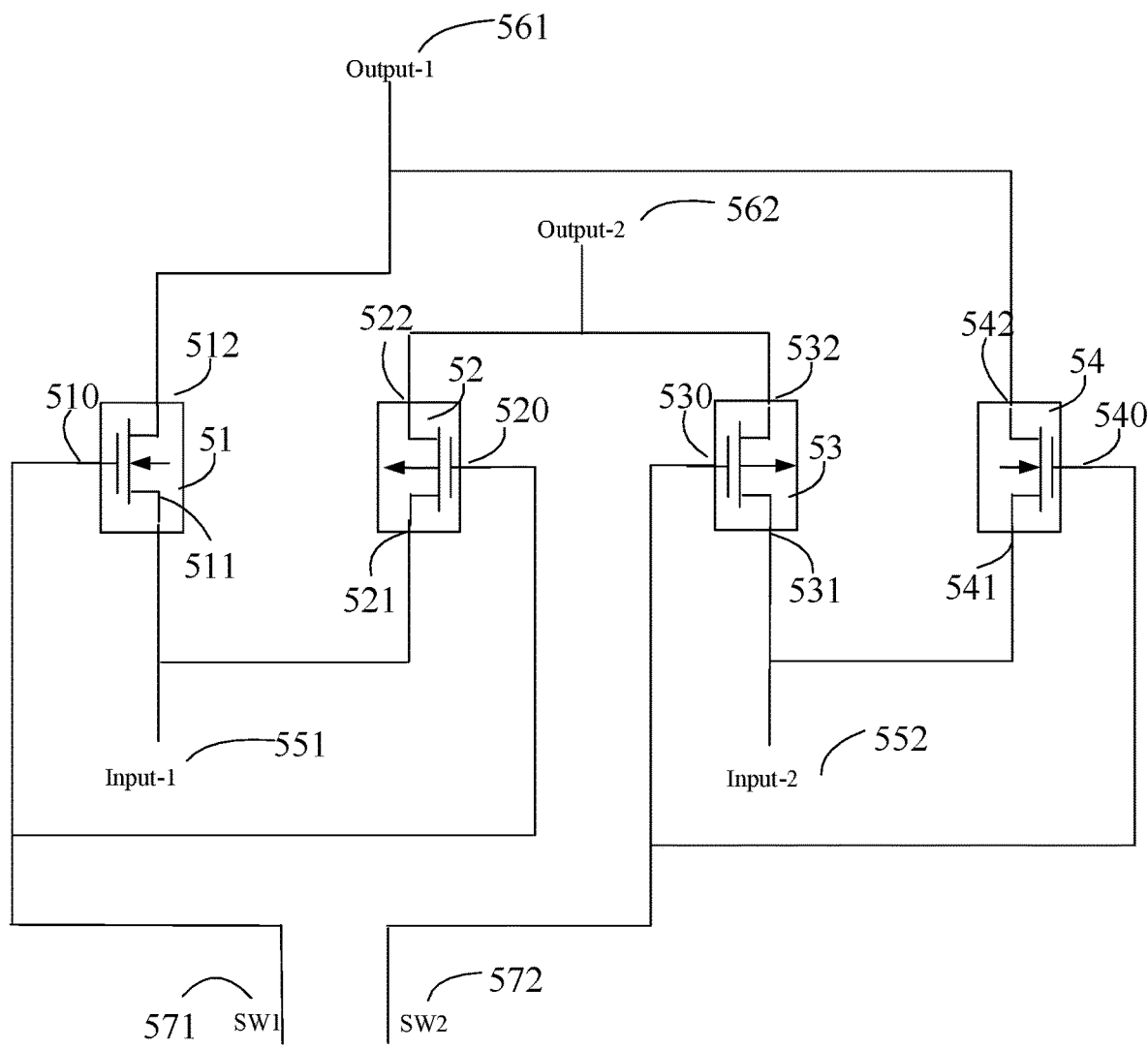
FIG. 5 is a schematic diagram of a structure of a conversion circuit according to another embodiment of the present disclosure.
Figure 6:
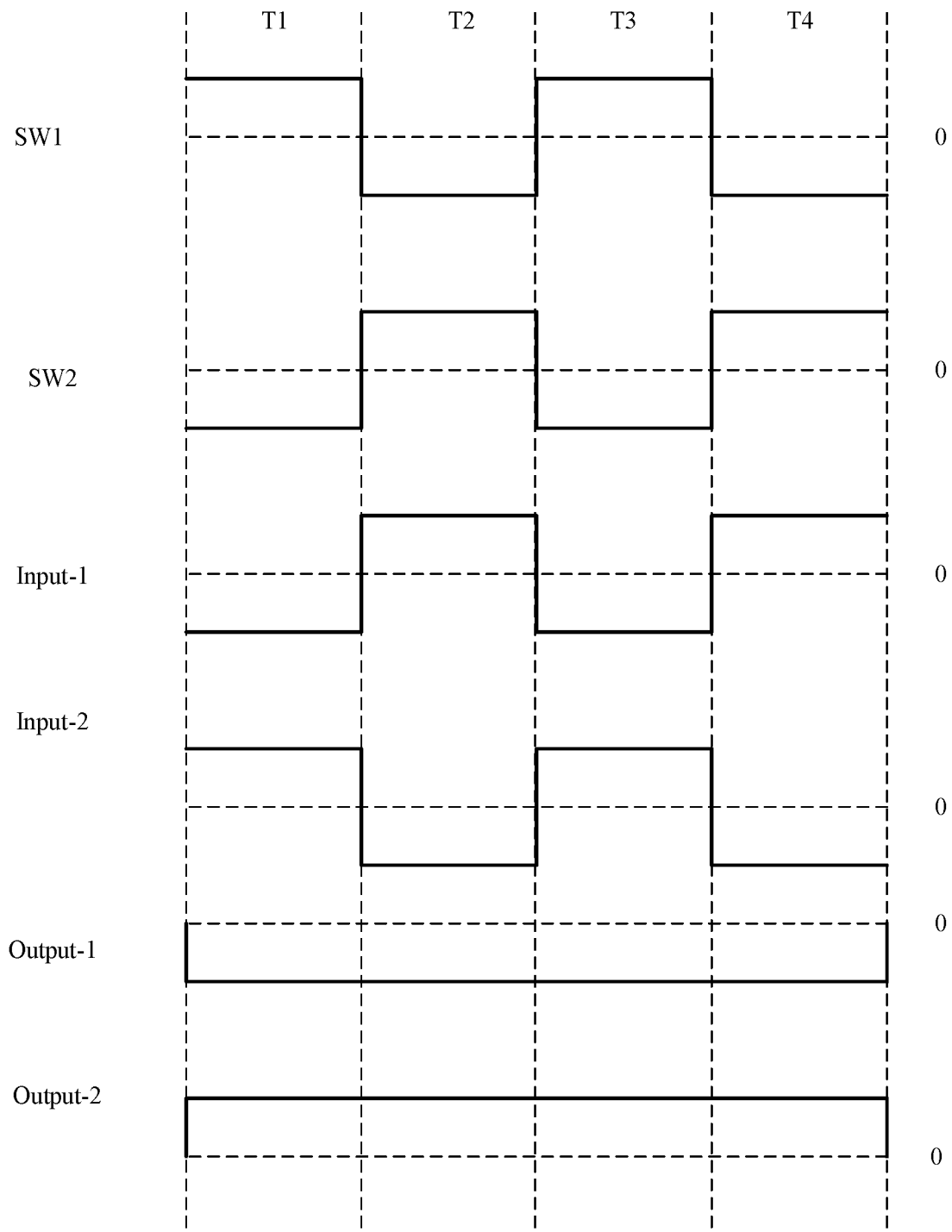
FIG. 6 is a time sequence diagram of an input/output signal at each terminal of the conversion circuit shown in FIG. 5.

FIG. 5 is a schematic diagram of a structure of a conversion circuit according to another embodiment of the present disclosure. FIG. 6 is a time sequence diagram of an input/output signal at each terminal of the conversion circuit shown in FIG. 5.

With reference to FIG. 5, the first transistor, the second transistor, the third transistor, and the fourth transistor of the conversion circuit are respectively an NMOS transistor 51, a PMOS transistor 52, a PMOS transistor 53, and an NMOS transistor 54.

Unlike with the conversion circuit shown in FIG. 2, a first switch signal input terminal 571 and a second switch signal input terminal 572 are provided in this embodiment. The first switch signal input terminal 571 receives a first switch control signal, and the second switch signal input terminal 572 receives a second switch control signal. The first switch control signal and the second switch control signal have opposite waveforms. A gate electrode 510 of the NMOS transistor 51 and a gate electrode 520 of the PMOS transistor 52 are connected to the first switch signal input terminal 571, and a gate electrode 530 of the PMOS transistor 53 and a gate electrode 540 of the NMOS transistor 54 are connected to the second switch signal input terminal 572.

The first input terminal 551 is connected to a first electrode 511 of the NMOS transistor 51 and a first electrode 521 of the PMOS transistor 52. The second input terminal 552 is connected to a first electrode 531 of the PMOS transistor 53 and a first electrode 541 of the NMOS transistor 54.

The first output terminal 561 is connected to a second electrode 512 of the NMOS transistor 51 and a second electrode 542 of the NMOS transistor 54. The second output terminal 562 is connected to a second electrode 522 of the PMOS transistor 52 and a second electrode 532 of the PMOS transistor 53.

FIG. 6 is a time sequence diagram of signals at the first switch signal input terminal 571, the switch signal input terminal 572, the first input terminal 551, the second input terminal 552, the first output terminal 561 and the second output terminal 562 of the conversion circuit shown in FIG. 5.

With reference to FIG. 5 and FIG. 6, in a period T1, the switch control signal received by the first switch signal input terminal 571 is a high-level signal, and the switch control signal received by the second switch signal input terminal 572 is a low-level signal. Therefore, the NMOS transistor 51 and the PMOS transistor 53 are turned on, and the PMOS transistor 52 and the NMOS transistor 54 are turned off. In this case, the first input terminal 551 is in communication with the first output terminal 561, and the second input terminal 552 is in communication with the second output terminal 562. Thus, the first output signal outputted from the first output terminal 561 and the first input signal have a same polarity, and the second output signal outputted from the second output terminal 562 and the second input signal have a same polarity. As shown in FIG. 6, during the period T1, the first input signal is a low-level signal and the second input signal is a high-level signal, and thus the first output signal has the same polarity as the first input signal and is a low-level signal, and the second output signal has the same polarity as the second input signal and is a high-level signal.

During a period T2, the switch control signal received by the first switch signal input terminal 571 is a low-level signal, and the switch control signal received by the second switch signal input terminal 572 is a high-level signal. Therefore, the NMOS transistor 51 and the PMOS transistor 53 are turned off, and the PMOS transistor 52 and the NMOS transistor 54 are turned on. In this case, the second input terminal 552 is in communication with the first output terminal 561, and the first input terminal 551 is in communication with the second output terminal 562. Thus, the first output signal outputted from the first output terminal 561 and the second input signal have a same polarity, and the second output signal outputted from the second output terminal 562 and the first input signal have a same polarity. As shown in FIG. 6, during the period T2, the first input signal is a high-level signal and the second input signal is a low-level signal, and thus the first output signal has the same polarity as the second input signal and is a low-level signal, and the second output signal has the same polarity as the first input signal and is a high-level signal.

Similarly, waveforms of signals of the first switch signal input terminal 571, the second switch signal input terminal 572, the first input terminal 551, the second input terminal 552, the first output terminal 561, and the second output terminal 562 during a period T3 are the same as those during the period T1. Therefore, during the period T3, the first output signal is a low-level signal, and the second output signal is a high-level signal.

Waveforms of signals of the first switch signal input terminal 571, the second switch signal input terminal 572, the first input terminal 551, the second input terminal 552, the first output terminal 561, and the second output terminal 562 during a period T4 are the same as those during the period T2. Therefore, during the period T4, the first output signal is a low-level signal, and the second output signal is a high-level signal.

It can be seen that during the periods T1-T4, although polarities of the first input signal and the second input signal received by the first input terminal 551 and the second input terminal 552 are different and alternately switch, each of the first output signal and the second output signal outputted from the first output terminal 561 and the second output terminal 562 has a constant polarity during any period. In this embodiment, the first output signal is always a low-level signal, and the second output signal is always a high-level signal.

Figure 7:
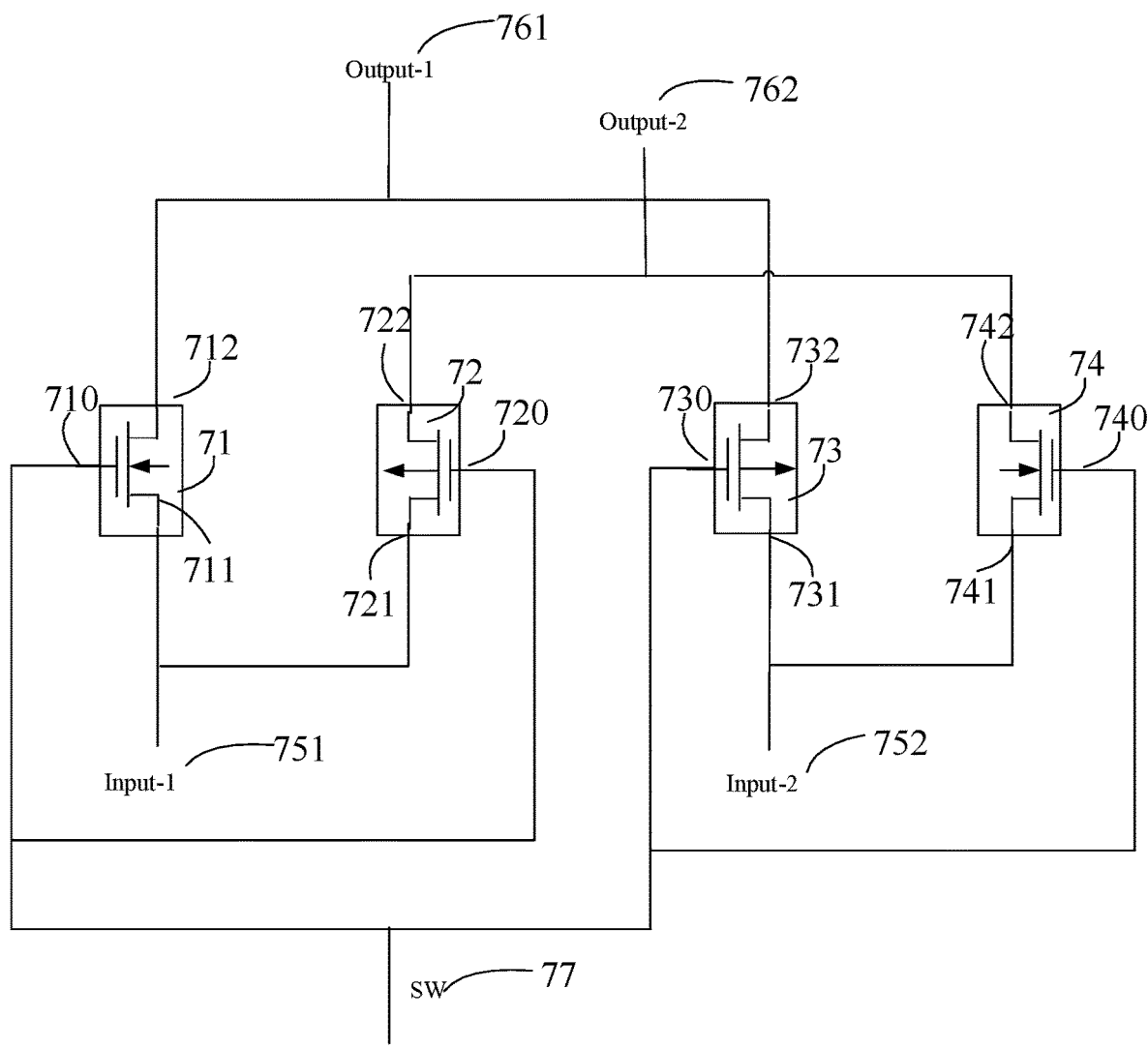
FIG. 7 is a schematic diagram of a structure of a conversion circuit according to still another embodiment of the present disclosure.
Figure 8:
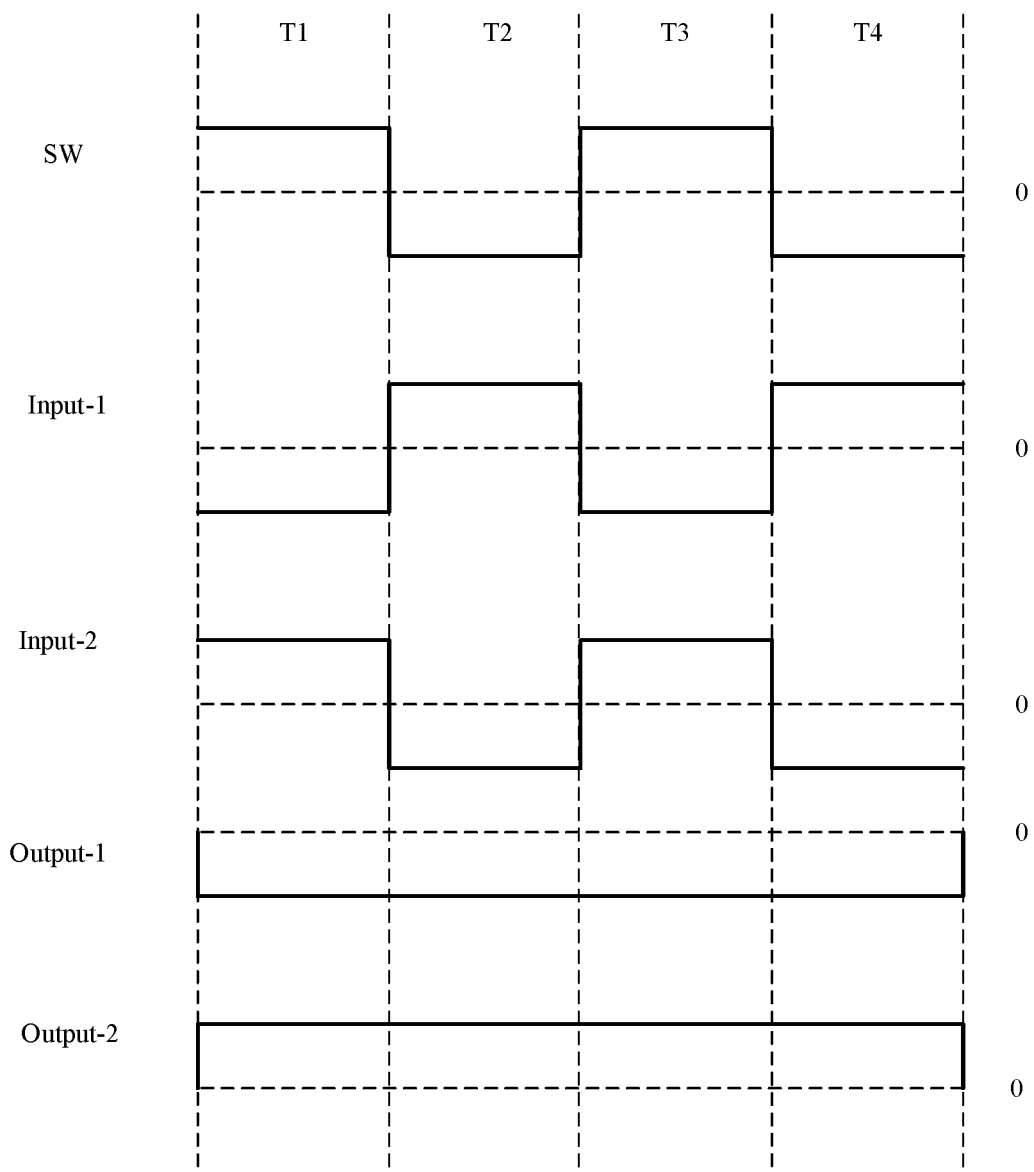
FIG. 8 is a time sequence diagram of an input/output signal at each terminal of the conversion circuit shown in FIG. 7.

FIG. 7 is a schematic diagram of a structure of a conversion circuit according to still another embodiment of the present disclosure. FIG. 8 is a time sequence diagram of an input/output signal at each terminal of the conversion circuit shown in FIG. 7.

With reference to FIG. 7, the first transistor, the second transistor, the third transistor, and the fourth transistor of the conversion circuit are respectively an NMOS transistor 71, a PMOS transistor 72, a PMOS transistor 73, and an NMOS transistor 74.

A gate electrode 710 of the NMOS transistor 71, a gate electrode 720 of the PMOS transistor 72, a gate electrode 730 of the PMOS transistor 73, and a gate electrode 740 of the NMOS transistor 74 are connected to a switch signal input terminal 77.

The first input terminal 751 is connected to a first electrode 711 of the NMOS transistor 71 and a first electrode 721 of the PMOS transistor 72. The second input terminal 752 is connected to a first electrode 731 of the PMOS transistor 73 and a first electrode 741 of the NMOS transistor 74.

The first output terminal 761 is connected to a second electrode 712 of the NMOS transistor 71 and a second electrode 732 of the PMOS transistor 73. The second output terminal 762 is connected to a second electrode 722 of the PMOS transistor 72 and a second electrode 742 of the NMOS transistor 74.

FIG. 8 is a time sequence diagram of signals at the switch signal input terminal 77, the first input terminal 751, the second input terminal 752, the first output terminal 761, and the second output terminal 762 of the conversion circuit shown in FIG. 7.

With reference to FIG. 7 and FIG. 8, during a period T1, the switch control signal received by the switch signal input terminal 27 is a high-level signal. Under control of the high-level signal, the NMOS transistor 71 and the NMOS transistor 74 are turned on, and the PMOS transistor 72 and the PMOS transistor 73 are turned off. In this case, the first input terminal 751 is in communication with the first output terminal 761, and the second input terminal 752 is in communication with the second output terminal 762. Thus, the first output signal outputted form the first output terminal 761 and the first input signal have a same polarity, and the second output signal outputted from the second output terminal 762 and the second input signal have a same polarity. As shown in FIG. 8, during the period T1, the first input signal is a low-level signal and the second input signal is a high-level signal, and thus the first output signal has the same polarity as the first input signal and is a low-level signal, and the second output signal has the same polarity as the second input signal and is a high-level signal.

During a period T2, the switch control signal received by the switch signal input terminal 77 is a low-level signal. Under control of the low-level signal, the NMOS transistor 71 and the NMOS transistor 74 are turned off, and the PMOS transistor 72 and the PMOS transistor 73 are turned on. In this case, the second input terminal 752 is in communication with the first output terminal 761, and the first input terminal 751 is in communication with the second output terminal 762. Thus, the first output signal outputted from the first output terminal 761 and the second input signal have a same polarity, and the second output signal outputted from the second output terminal 762 and the first input signal have a same polarity. As shown in FIG. 8, during the period T2, the first input signal is a high-level signal and the second input signal is a low-level signal, and thus the first output signal has the same polarity as the second input signal and is a low-level signal, and the second output signal has the same polarity as the first input signal and is a high-level signal.

Similarly, waveforms of signals of the switch signal input terminal 77, the first input terminal 751, the second input terminal 752, the first output terminal 761, and the second output terminal 762 during a period T3 are the same as those during the period T1. Therefore, during the period T3, the first output signal is a low-level signal, and the second output signal is a high-level signal.

Waveforms of signals of the switch signal input terminal 77, the first input terminal 751, the second input terminal 752, the first output terminal 761 and the second output terminal 762 during a period T4 are the same as those during the period T2. Therefore, during the period T4, the first output signal is a low-level signal, and the second output signal is a high-level signal.

It can be seen that during the periods T1-T4, although polarities of the first input signal and the second input signal received by the first input terminal 751 and the second input terminal 752 are different and alternately switch, each of the first output signal and the second output signal outputted from the first output terminal 761 and the second output terminal 762 has a constant polarity during any period. In this embodiment, the first output signal is always a low-level signal, and the second output signal is always a high-level signal.

Figure 9:
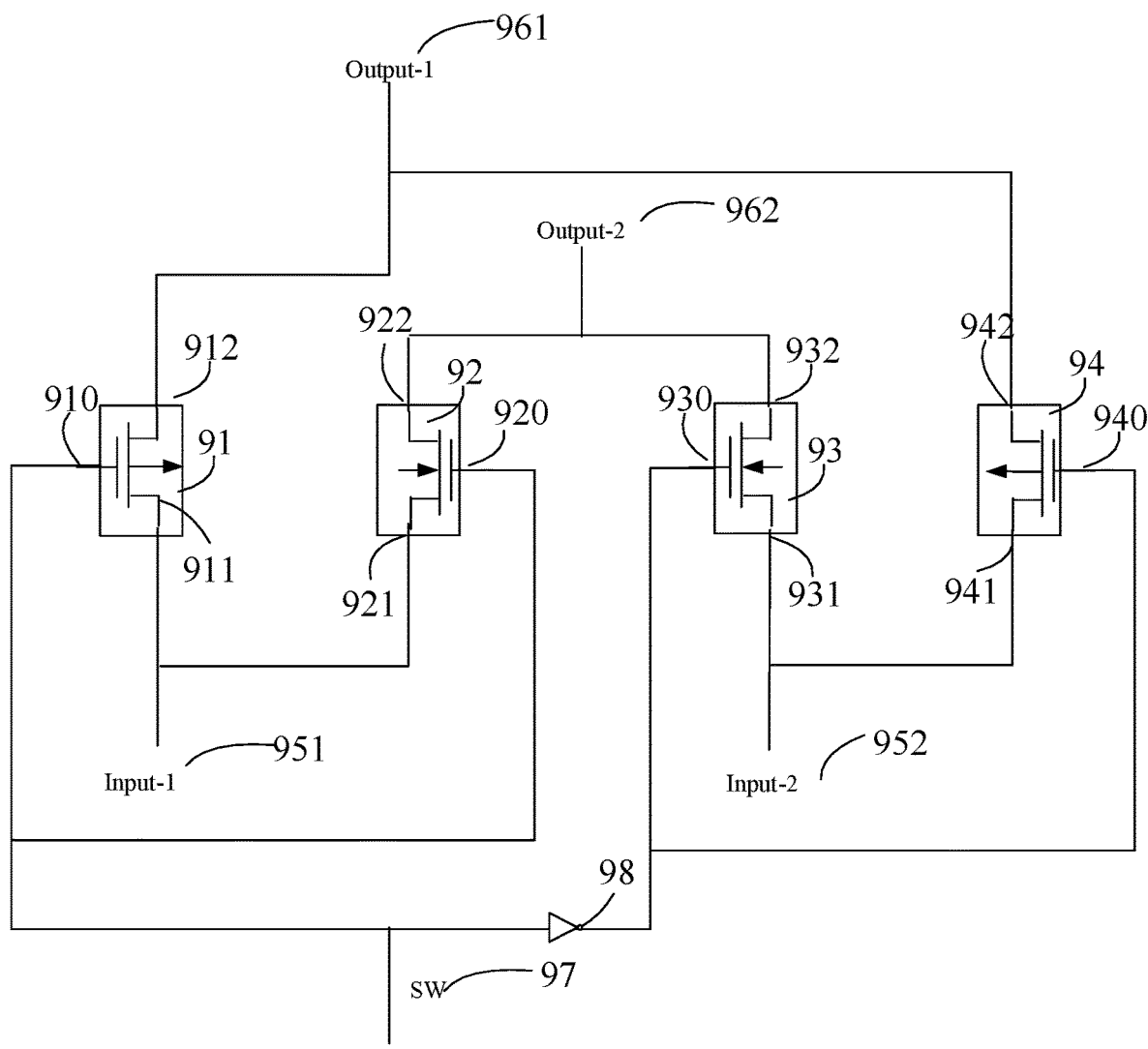
FIG. 9 is a schematic diagram of a structure of a conversion circuit according to yet another embodiment of the present disclosure.
Figure 10:
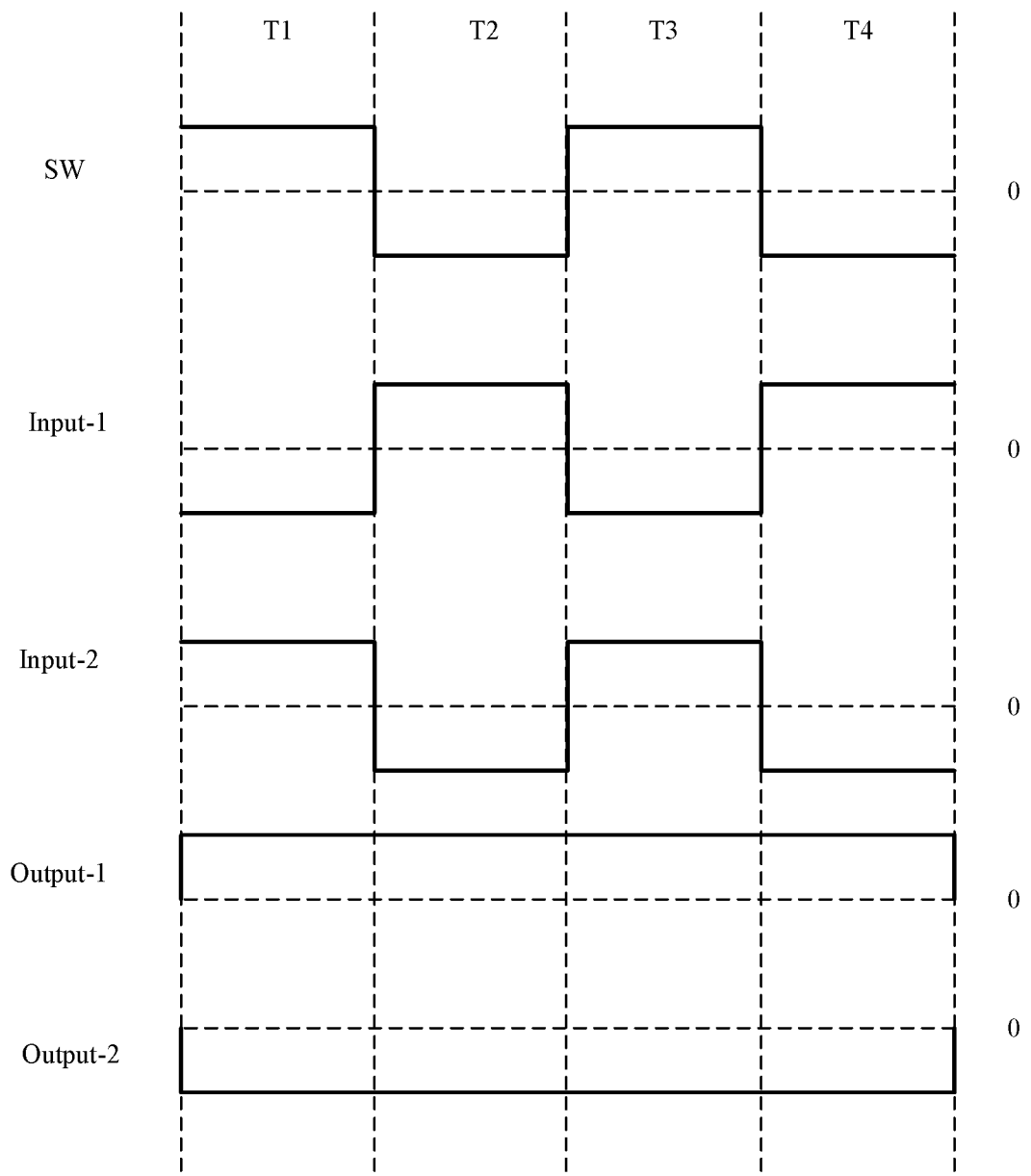
FIG. 10 is a time sequence diagram of an input/output signal at each terminal of the conversion circuit shown in FIG. 9.

FIG. 9 is a schematic diagram of a structure of a conversion circuit according to yet another embodiment of the present disclosure, and FIG. 10 is a time sequence diagram of an input/output signal at each terminal of the conversion circuit shown in FIG. 9.

With reference to FIG. 9, the first transistor, the second transistor, the third transistor, and the fourth transistor of the conversion circuit are respectively a PMOS transistor 91, an NMOS transistor 92, an NMOS transistor 93, and a PMOS transistor 94. A gate electrode 910 of the PMOS transistor 91, a gate electrode 920 of the NMOS transistor 92, a gate electrode 930 of the NMOS transistor 93, and a gate electrode 940 of the PMOS transistor 94 are connected to the switch signal input terminal 97.

The first input terminal 951 is connected to a first electrode 911 of the PMOS transistor 91 and a first electrode 921 of the NMOS transistor 92. The second input terminal 952 is connected to a first electrode 931 of the NMOS transistor 93 and a first electrode 941 of the PMOS transistor 94.

The first output terminal 961 is connected to a second electrode 912 of the PMOS transistor 91 and a second electrode 942 of the PMOS transistor 94. The second output terminal 962 is connected to a second electrode 922 of the NMOS transistor 92 and a second electrode 932 of the NMOS transistor 93.

In this embodiment, the conversion circuit further includes a first waveform converter 98. The first waveform converter 98 has a terminal connected to the switch signal input terminal 97, and another terminal connected to the gate electrode 930 of the NMOS transistor 93 and the gate electrode 940 of the PMOS transistor 94. The first waveform converter 98 is configured to invert a level of the switch control signal received from the switch signal input terminal 97 and then transmit it to the gate electrode 930 of the PMOS transistor 93 and the gate electrode 940 of the NMOS transistor 94.

FIG. 10 is a time sequence diagram of signals at the switch signal input terminal 97, the first input terminal 951, the second input terminal 952, the first output terminal 961, and the second output terminal 962 of the conversion circuit shown in FIG. 9.

With reference to FIG. 9 and FIG. 10, during a period T1, the switch control signal received by the switch signal input terminal 97 is a high-level signal. Under control of the high-level signal, the NMOS transistor 92 and the PMOS transistor 94 are turned on, and the PMOS transistor 91 and the NMOS transistor 93 are turned off. In this case, the first input terminal 951 is in communication with the second output terminal 962, and the second input terminal 952 is in communication with the first output terminal 962. Thus, the first output signal outputted from the first output terminal 961 and the second input signal have a same polarity, and the second output signal outputted from the second output terminal 962 and the first input signal have a same polarity. As shown in FIG. 10, during the period T1, the first input signal is a low-level signal and the second input signal is a high-level signal, and thus the first output signal has the same polarity as the second input signal and is a high-level signal, and the second output signal that the same polarity as the first input signal and is a low-level signal.

During a period T2, the switch control signal received by the switch signal input terminal 97 is a low-level signal. Under control of the low-level signal, the NMOS transistor 92 and the PMOS transistor 94 are turned off, and the PMOS transistor 91 and the NMOS transistor 93 are turned on. In this case, the second input terminal 952 is in communication with the second output terminal 962, and the first input terminal 951 is in communication with the first output terminal 961. Thus, the first output signal outputted from the first output terminal 961 and the first input signal have a same polarity, and the second output signal outputted from the second output terminal 962 and the second input signal have a same polarity. As shown in FIG. 10, during the period T2, the first input signal is a high-level signal and the second input signal is a low-level signal, and thus the first output signal has the same polarity as the first input signal and is a high-level signal, and the second output signal has the same polarity as the second input signal and is a low-level signal.

Similarly, waveforms of signals of the switch signal input terminal 97, the first input terminal 951, the second input terminal 952, the first output terminal 961, and the second output terminal 962 during a period T3 are the same as those during the period T1. Therefore, during the period T3, the first output signal is a high-level signal, and the second output signal is a low-level signal.

Waveforms of signals of the switch signal input terminal 97, the first input terminal 951, the second input terminal 952, the first output terminal 961, and the second output terminal 962 during a period T4 are the same as those during the period T2. Therefore, during the period T4, the first output signal is a high-level signal, and the second output signal is a low-level signal.

It can be seen that during the periods T1-T4, although polarities of the first input signal and the second input signal received by the first input terminal 951 and the second input terminal 952 are different and alternately switch, each of the first output signal and the second output signal outputted from the first output terminal 961 and the second output terminal 962 has a constant polarity during any period. In this embodiment, the first output signal is always a high-level signal, and the second output signal is always a low-level signal.

Figure 11:
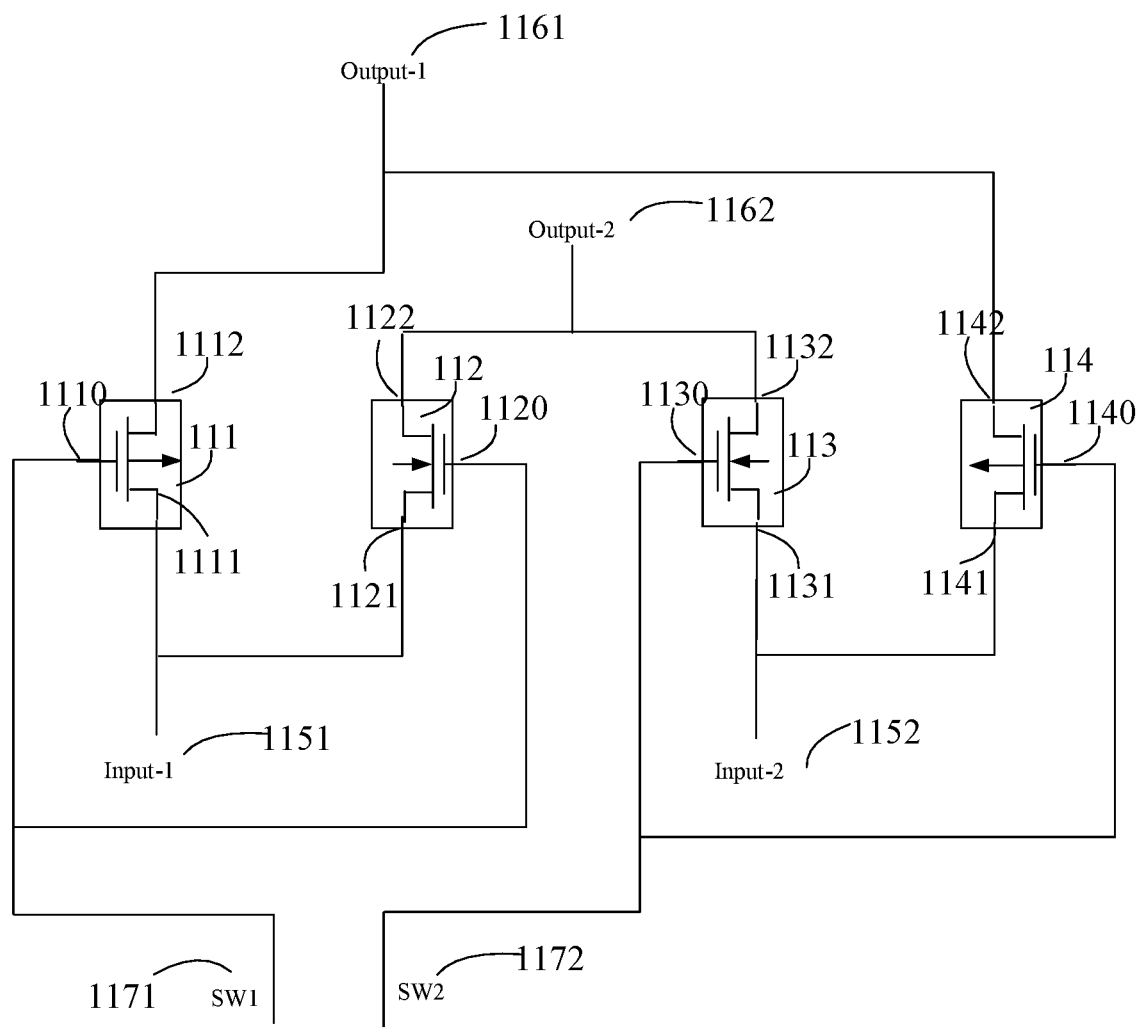
FIG. 11 is a schematic diagram of a structure of a conversion circuit according to yet another embodiment of the present disclosure.
Figure 12:
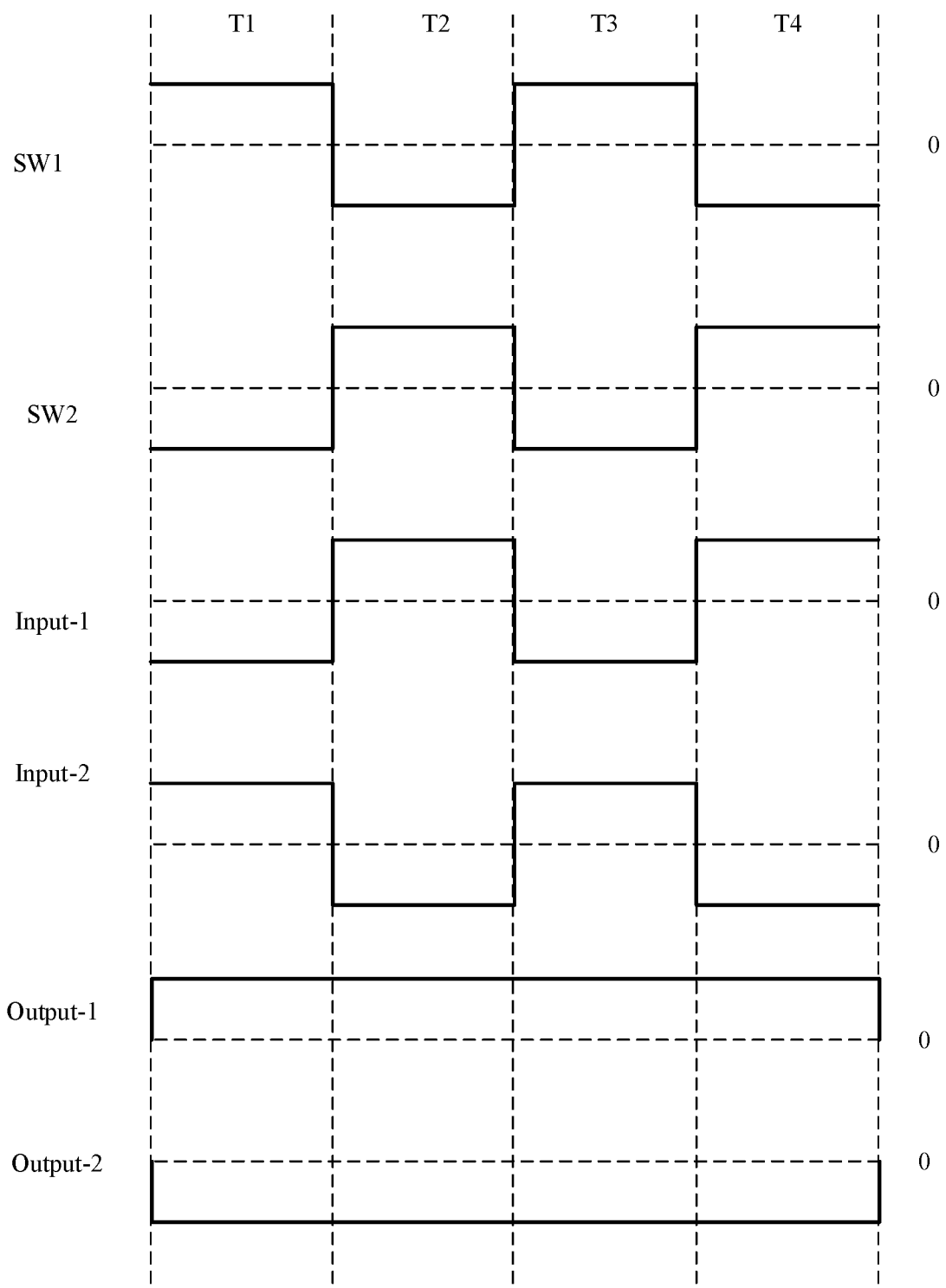
FIG. 12 is a time sequence diagram of an input/output signal at each terminal of the conversion circuit shown in FIG. 11.

FIG. 11 is a schematic diagram of a structure of a conversion circuit according to yet another embodiment of the present disclosure, FIG. 12 is a time sequence diagram of an input/output signal at each terminal of the conversion circuit shown in FIG. 11.

With reference to FIG. 11, the first transistor, the second transistor, the third transistor, and the fourth transistor of the conversion circuit are respectively a PMOS transistor 111, an NMOS transistor 112, an NMOS transistor 113, and a PMOS transistor 114.

Unlike with the conversion circuit shown in FIG. 9, a first switch signal input terminal 1171 and a second switch signal input terminal 1172 are provided in this embodiment. The first switch signal input terminal 1171 receives a first switch control signal, and the second switch signal input terminal 1172 receives a second switch control signal. The first switch control signal and the second switch control signal have opposite waveforms. A gate electrode 1110 of the PMOS transistor 111 and a gate electrode 1120 of the NMOS transistor 112 are connected to the first switch signal input terminal 1171, and a gate electrode 1130 of the NMOS transistor 113 and a gate electrode 1140 of the PMOS transistor 114 are connected to the second switch signal input terminal 1172.

The first input terminal 1151 is connected to a first electrode 1111 of the PMOS transistor 111 and a first electrode 1121 of the NMOS transistor 112. The second input terminal 1152 is connected to a first electrode 1131 of the NMOS transistor 113 and a first electrode 1141 of the PMOS transistor 114.

The first output terminal 1161 is connected to a second electrode 1112 of the PMOS transistor 111 and a second electrode 1142 of the PMOS transistor 114. The second output terminal 1162 is connected to a second electrode 1122 of the NMOS transistor 112 and a second electrode 1132 of the NMOS transistor 113.

FIG. 12 is a time sequence diagram of signals at the first switch signal input terminal 1171, the second switch signal input terminal 1172, the first input terminal 1151, the second input terminal 1152, the first output terminal 1161, and the second output terminal 1162 of the conversion circuit shown in FIG. 11.

With reference to FIG. 11 and FIG. 12, during a period T1, the switch control signal received by the first switch signal input terminal 1171 is a high-level signal, and the switch control signal received by the second switch signal input terminal 1172 is a low-level signal. Therefore, the PMOS transistor 111 and the NMOS transistor 113 are turned off, and the NMOS transistor 112 and the PMOS transistor 114 are turned on. In this case, the first input terminal 1151 is in communication with the second output terminal 1162, and the second input terminal 1152 is in communication with the first output terminal 1161. Thus, the first output signal outputted from the first output terminal 1161 and the second input signal have a same polarity, and the second output signal outputted from the second output terminal 1162 and the first input signal have a same polarity. As shown in FIG. 12, during the period T1, the first input signal is a low-level signal and the second input signal is a high-level signal, and thus the first output signal has the same polarity as the second input signal and is a high-level signal, and the second output signal has the same polarity as the first input signal and is a low-level signal.

During the period T2, the switch control signal received by the first switch signal input terminal 1171 is a low-level signal, and the switch control signal received by the second switch signal input terminal 1172 is a high-level signal. Therefore, the PMOS transistor 111 and the NMOS transistor 113 are turned on, and the NMOS transistor 112 and the PMOS transistor 114 are turned off. In this case, the second input terminal 1152 is in communication with the second output terminal 1162, and the first input terminal 1151 is in communication with the first output terminal 1161. Thus, the first output signal outputted from the first output terminal 1161 and the first input signal have a same polarity, and the second output signal outputted from the second output terminal 1162 and the second input signal have a same polarity. As shown in FIG. 12, during the period T2, the first input signal is a high-level signal and the second input signal is a low-level signal, and thus the first output signal has the same polarity as the first input signal and is a high-level signal, and the second output signal has the same polarity as the second input signal and is a low-level signal.

Similarly, waveforms of signals of the first switch signal input terminal 1171, the second switch signal input terminal 1172, the first input terminal 1151, the second input terminal 1152, the first output terminal 1161, and the second output terminal 1162 during a period T3 are the same as those during the period T1. Therefore, during the period T3, the first output signal is a high-level signal, and the second output signal is a low-level signal.

Waveforms of signals of the first switch signal input terminal 1171, the second switch signal input terminal 1172, the first input terminal 1151, the second input terminal 1152, the first output terminal 1161, and the second output terminal 1162 during a period T4 are the same as those during the period T2. Therefore, during the period T4, the first output signal is a high-level signal, and the second output signal is a low-level signal.

It can be seen that during the periods T1-T4, although polarities of the first input signal and the second input signal received by the first input terminal 1151 and the second input terminal 1152 are different and alternately switch, each of the first output signal and the second output signal outputted from the first output terminal 1161 and the second output terminal 1162 has a constant polarity during any period. In this embodiment, the first output signal is always a high-level signal, and the second output signal is always a low-level signal.

Figure 13:
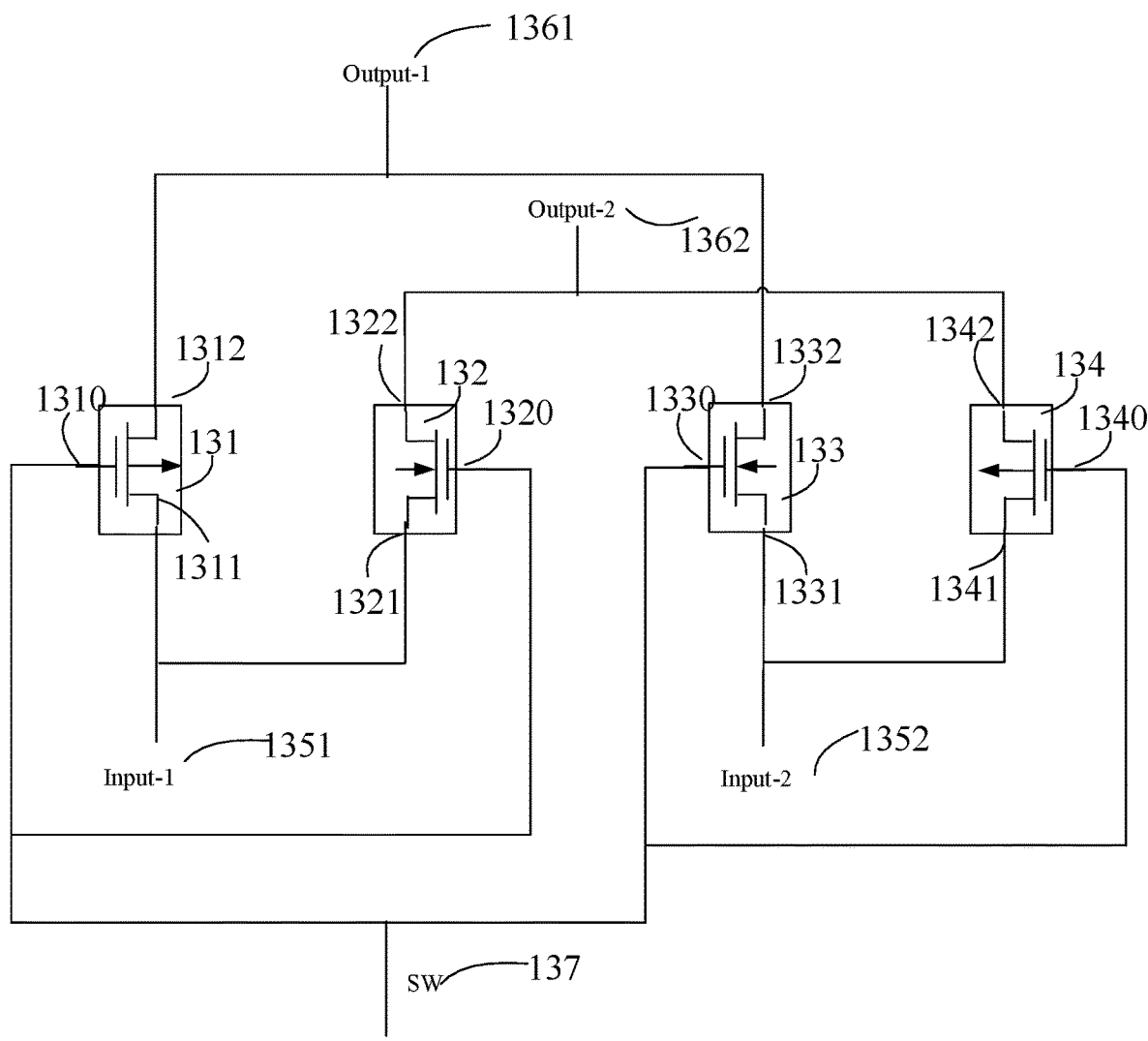
FIG. 13 is a schematic diagram of a structure of a conversion circuit according to yet another embodiment of the present disclosure.
Figure 14:
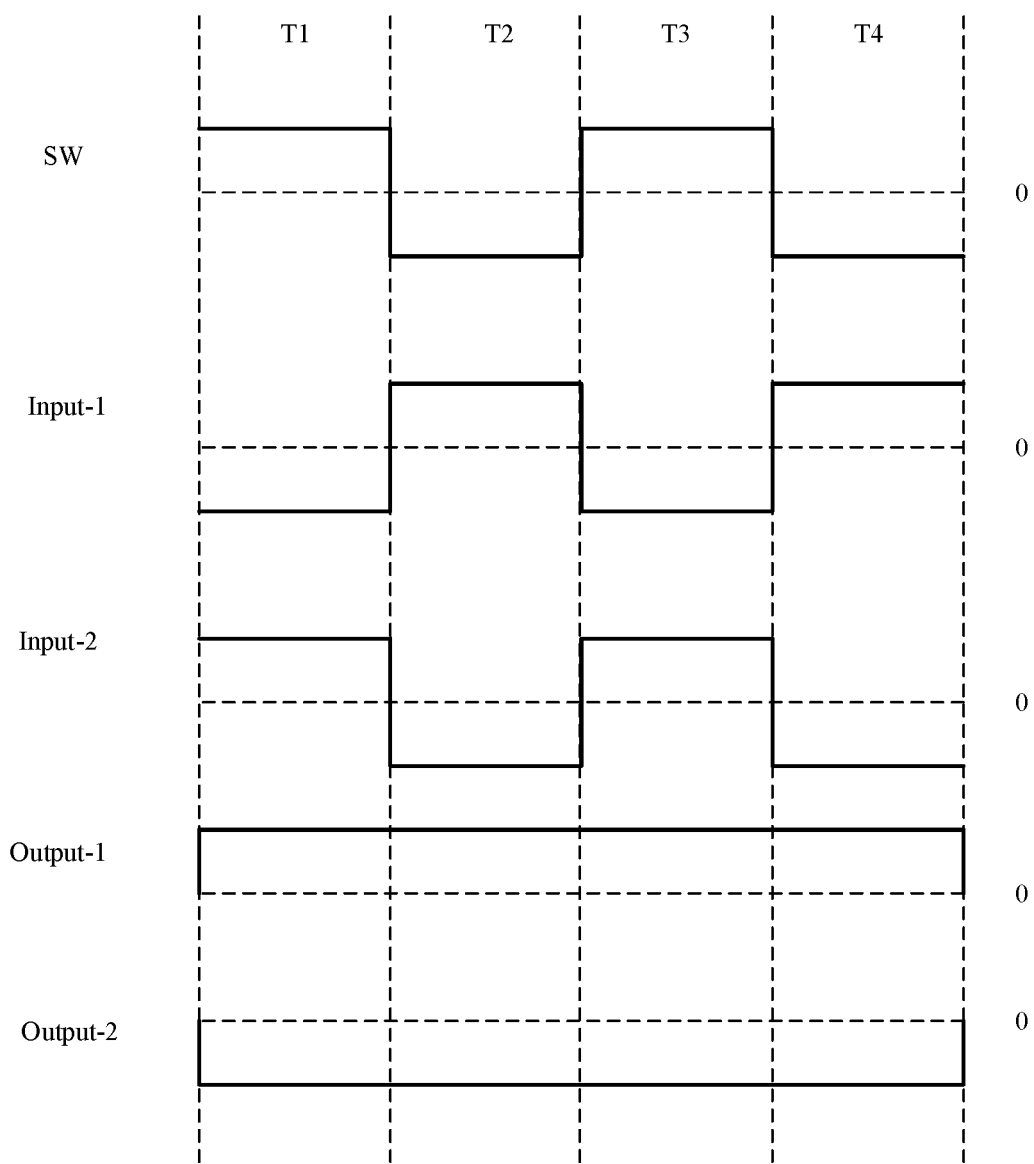
FIG. 14 is a time sequence diagram of an input/output signal at each terminal of the conversion circuit shown in FIG. 13.

FIG. 13 is a schematic diagram of a structure of a conversion circuit according to yet another embodiment of the present disclosure, FIG. 14 is a time sequence diagram of an input/output signal at each terminal of the conversion circuit shown in FIG. 13.

With reference to FIG. 13, the first transistor, the second transistor, the third transistor, and the fourth transistor of the conversion circuit are respectively a PMOS transistor 131, an NMOS transistor 132, an NMOS transistor 133, and a PMOS transistor 134.

A gate electrode 1310 of the PMOS transistor 131, a gate electrode 1320 of the NMOS transistor 132, a gate electrode 1330 of the NMOS transistor 133, and a gate electrode 1340 of the PMOS transistor 134 are connected to a switch signal input terminal 137.

The first input terminal 1351 is connected to a first electrode 1311 of the PMOS transistor 131 and a first electrode 1321 of the NMOS transistor 132. The second input terminal 132 is connected to a first electrode 1331 of the NMOS transistor 133 and a first electrode 1341 of the PMOS transistor 134.

The first output terminal 1361 is connected to a second electrode 1312 of the PMOS transistor 131 and a second electrode 1332 of the NMOS transistor 133. The second output terminal 1362 is connected to a second electrode 1322 of the NMOS transistor 132 and a second electrode 1342 of the PMOS transistor 134.

FIG. 14 is a time sequence diagram of signals at the switch signal input terminal 137, the first input terminal 1351, the second input terminal 1352, the first output terminal 1361, and the second output terminal 1362 of the conversion circuit shown in FIG. 13.

With reference to FIG. 13 and FIG. 14, during a period T1, the switch control signal received by the switch signal input terminal 137 is a high-level signal. Under control of the high-level signal, the NMOS transistor 132 and the NMOS transistor 133 are turned on, and the PMOS transistor 131 and the PMOS transistor 134 are turned off. In this case, the first input terminal 1351 is in communication with the second output terminal 1362, and the second input terminal 1352 is in communication with the first output terminal 1361. Thus, the first output signal outputted from the first output terminal 1361 and the second input signal have a same polarity, and the second output signal outputted from the second output terminal 1362 and the first input signal have a same polarity. As shown in FIG. 14, during the period T1, the first input signal is a low-level signal and the second input signal is a high-level signal, and thus the first output signal has the same polarity as the second input signal and is a high-level signal, and the second output signal has the same polarity as the first input signal and is a low-level signal.

During a period T2, the switch control signal received by the switch signal input terminal 137 is a low-level signal. Under control of the low-level signal, the NMOS transistor 132 and the NMOS transistor 133 are turned off, and the PMOS transistor 131 and the PMOS transistor 134 are turned on. In this case, the second input terminal 1352 is in communication with the second output terminal 1362, and the first input terminal 1351 is communication with the first output terminal 1361. Thus, the first output signal outputted from the first output terminal 1361 and the first input signal have a same polarity, and the second output signal outputted from the second output terminal 1362 and the second input signal have a same polarity. As shown in FIG. 14, during the period T2, the first input signal is a high-level signal and the second input signal is a low-level signal, and thus the first output signal has the same polarity as the first input signal and is a high-level signal, and the second output signal has the same polarity as the second input signal and is a low-level signal.

Similarly, waveforms of signals of the switch signal input terminal 137, the first input terminal 1351, the second input terminal 1352, the first output terminal 1361, and the second output terminal 1362 during a period T3 are the same as those during the period T1. Therefore, during the period T3, the first output signal is a high-level signal, and the second output signal is a low-level signal.

Waveforms of signals of the switch signal input terminal 137, the first input terminal 1351, the second input terminal 1352, the first output terminal 1361, and the second output terminal 1362 during a period T4 are the same as those during the period T2. Therefore, during the period T4, the first output signal is a high-level signal, and the second output signal is a low-level signal.

It can be seen that during the periods T1-T4, although polarities of the first input signal and the second input signal received by the first input terminal 1351 and the second input terminal 1352 are different and alternately switch, each of the first output signal and the second output signal outputted from the first output terminal 1361 and the second output terminal 1362 has a constant polarity during any period. In this embodiment, the first output signal is always a low-level signal, and the second output signal is always a high-level signal.

Figure 15:
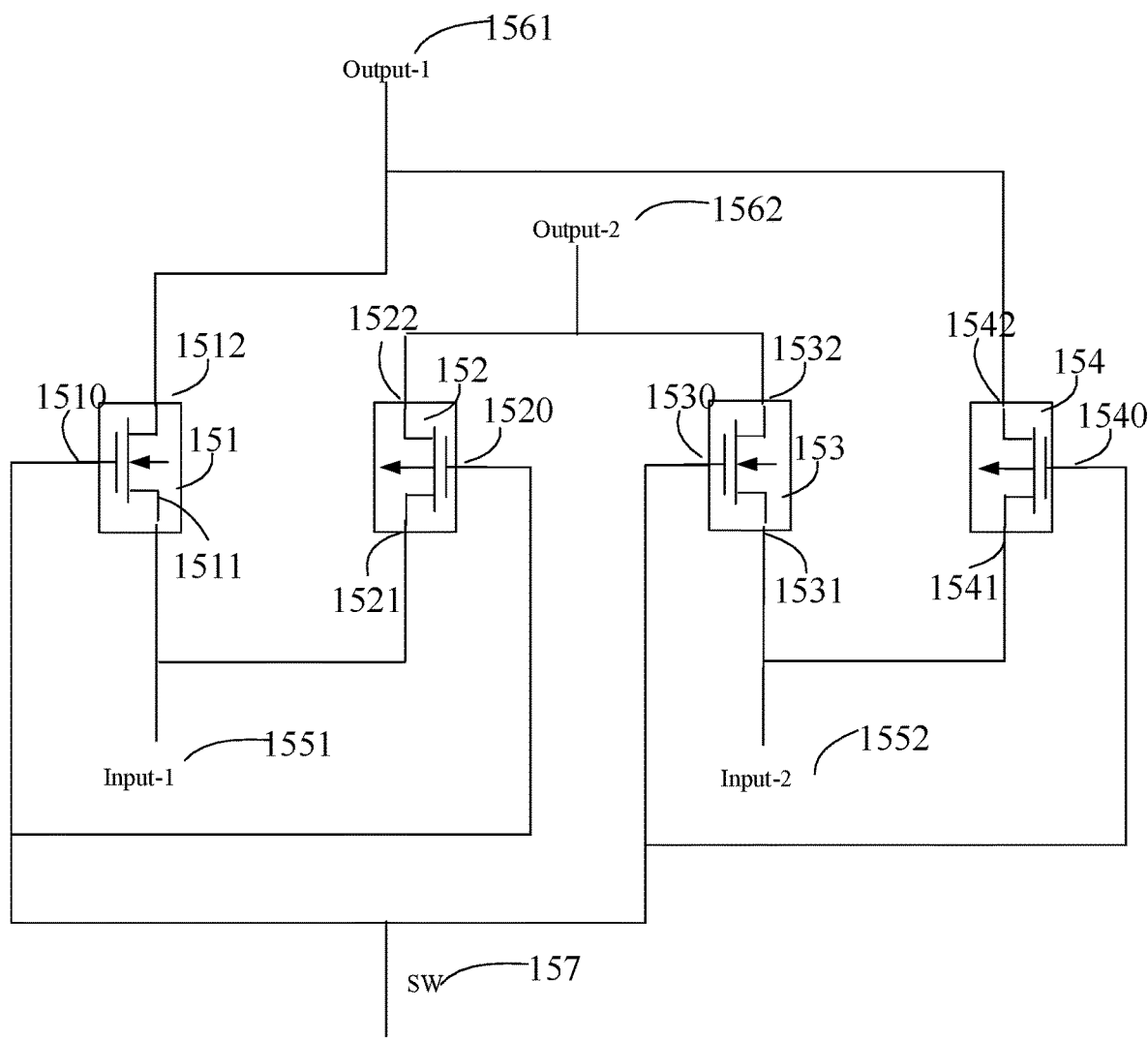
FIG. 15 is a schematic diagram of a structure of a conversion circuit according to yet another embodiment of the present disclosure.
Figure 16:
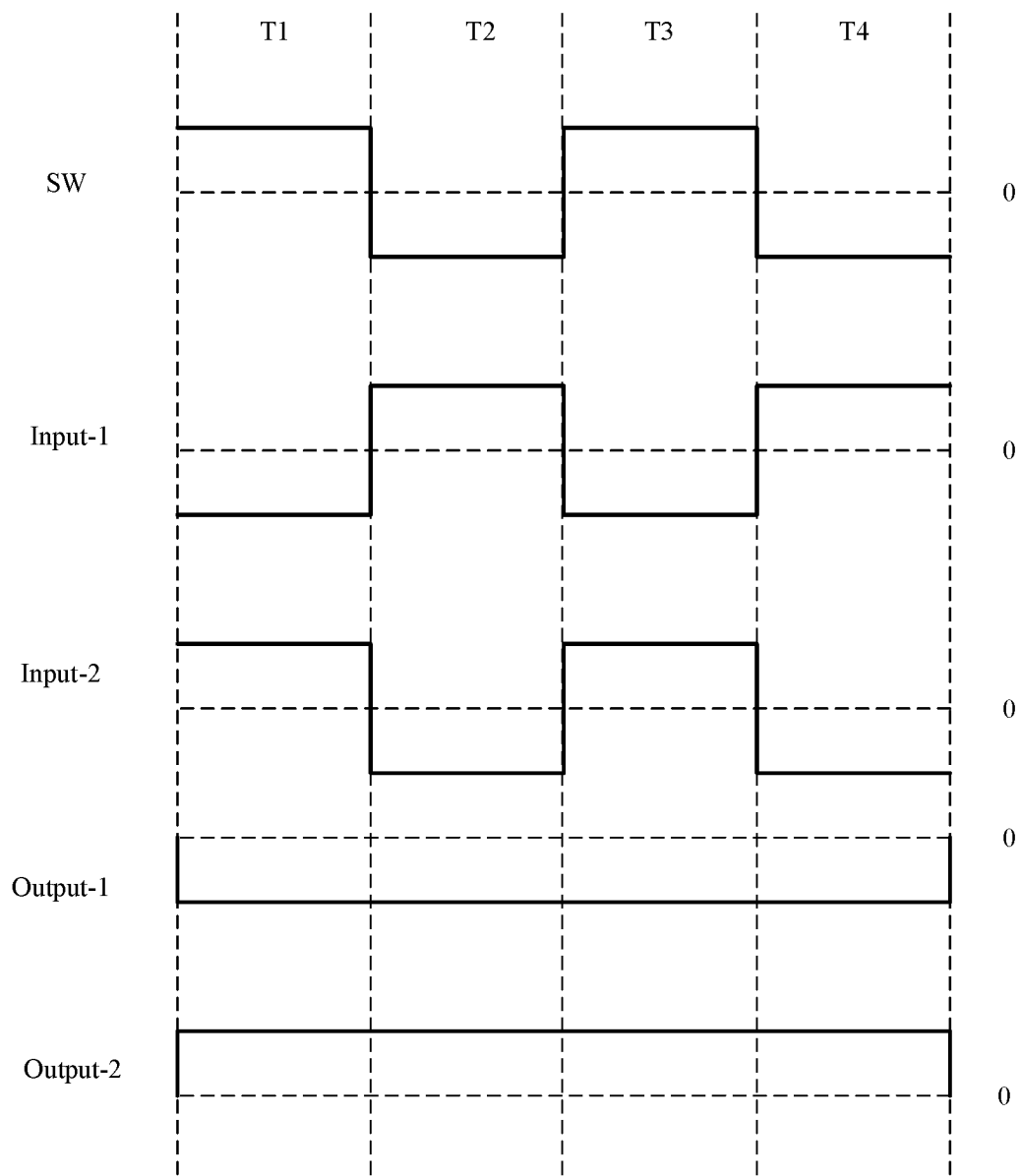
FIG. 16 is a time sequence diagram of an input/output signal at each terminal of the conversion circuit shown in FIG. 15.

FIG. 15 is a schematic diagram of a structure of a conversion circuit according to yet another embodiment of the present disclosure, FIG. 16 is a time sequence diagram of an input/output signal at each terminal of the conversion circuit shown in FIG. 15.

With reference to FIG. 15, the first transistor, the second transistor, the third transistor, and the fourth transistor of the conversion circuit are respectively an NMOS transistor 151, a PMOS transistor 152, an NMOS transistor 153, and a PMOS transistor 154. A gate electrode 1510 of the NMOS transistor 151, a gate electrode 1520 of the PMOS transistor 152, a gate electrode 1530 of the NMOS transistor 153, and a gate electrode 1540 of the PMOS transistor 154 are connected to a switch signal input terminal 157.

The first input terminal 1551 is connected to a first electrode 1511 of the NMOS transistor 151 and a first electrode 1521 of the PMOS transistor 152. The second input terminal 1552 is connected to a first electrode 1531 of the NMOS transistor 153 and a first electrode 1541 of the PMOS transistor 154.

The first output terminal 1561 is connected to a second electrode 1512 of the NMOS transistor 151 and a second electrode 1542 of the PMOS transistor 154. The second output terminal 1562 is connected to a second electrode 1522 of the PMOS transistor 152 and a second electrode 1532 of the NMOS transistor 153.

FIG. 16 is a time sequence diagram of signals at the switch signal input terminal 157, the first input terminal 1551, the second input terminal 1552, the first output terminal 1561 and the second output terminal 1562 of the conversion circuit shown in FIG. 15.

With reference to FIG. 15 and FIG. 16, during a period T1, the switch control signal received by the switch signal input terminal 157 is a high-level signal. Under control of the high-level signal, the NMOS transistor 151 and the NMOS transistor 153 are turned on, and the PMOS transistor 152 and the PMOS transistor 154 are turned off. In this case, the first input terminal 1551 is in communication with the first output terminal 1561, and the second input terminal 1552 is in communication with the second output terminal 1562. Thus, the first output signal outputted from the first output terminal 1561 and the first input signal have a same polarity, and the second output signal outputted from the second output terminal 1562 and the second input signal have a same polarity. As shown in FIG. 16, during the period T1, the first input signal is a low-level signal and the second input signal is a high-level signal, and thus the first output signal has the same polarity as the first input signal and is a low-level signal, and the second output signal has the same polarity as the second input signal and is a high-level signal.

During a period T2, the switch control signal received by the switch signal input terminal 157 is a low-level signal. Under control of the low-level signal, the NMOS transistor 151 and the NMOS transistor 153 are turned off, and the PMOS transistor 152 and the PMOS transistor 154 are turned on. In this case, the second input terminal 1552 is in communication with the first output terminal 1561, and the first input terminal 1551 is in communication with the second output terminal 1562. Thus, the first output signal outputted from the first output terminal 1561 and the second input signal have a same polarity, and the second output signal outputted from the second output terminal 1562 and the first input signal have a same polarity. As shown in FIG. 16, during the period T2, the first input signal is a high-level signal and the second input signal is a low-level signal, and thus the first output signal has the same polarity as the second input signal and is a low-level signal, and the second output signal has the same polarity as the first input signal and is a high-level signal.

Similarly, during a period T3, waveforms of signals of the switch signal input terminal 157, the first input terminal 1551, the second input terminal 1552, the first output terminal 1561, and the second output terminal 1562 during a period T3 are the same as those during the period T1. Therefore, during the period T3, the first output signal is a low-level signal, and the second output signal is a high-level signal.

Waveforms of signals of the switch signal input terminal 157, the first input terminal 1551, the second input terminal 1552, the first output terminal 1561 and the second output terminal 1562 during a period T4 are the same as those during the period T2. Therefore, during the period T4, the first output signal is a low-level signal, and the second output signal is a high-level signal.

It can be seen that during the periods T1-T4, although polarities of the first input signal and the second input signal received by the first input terminal 1551 and the second input terminal 1552 are different and alternately switch, each of the first output signal and the second output signal outputted from the first output terminal 1561 and the second output terminal 1562 has a constant polarity during any period. In this embodiment, the first output signal is always a low-level signal, and the second output signal is always a high-level signal.

Figure 17:
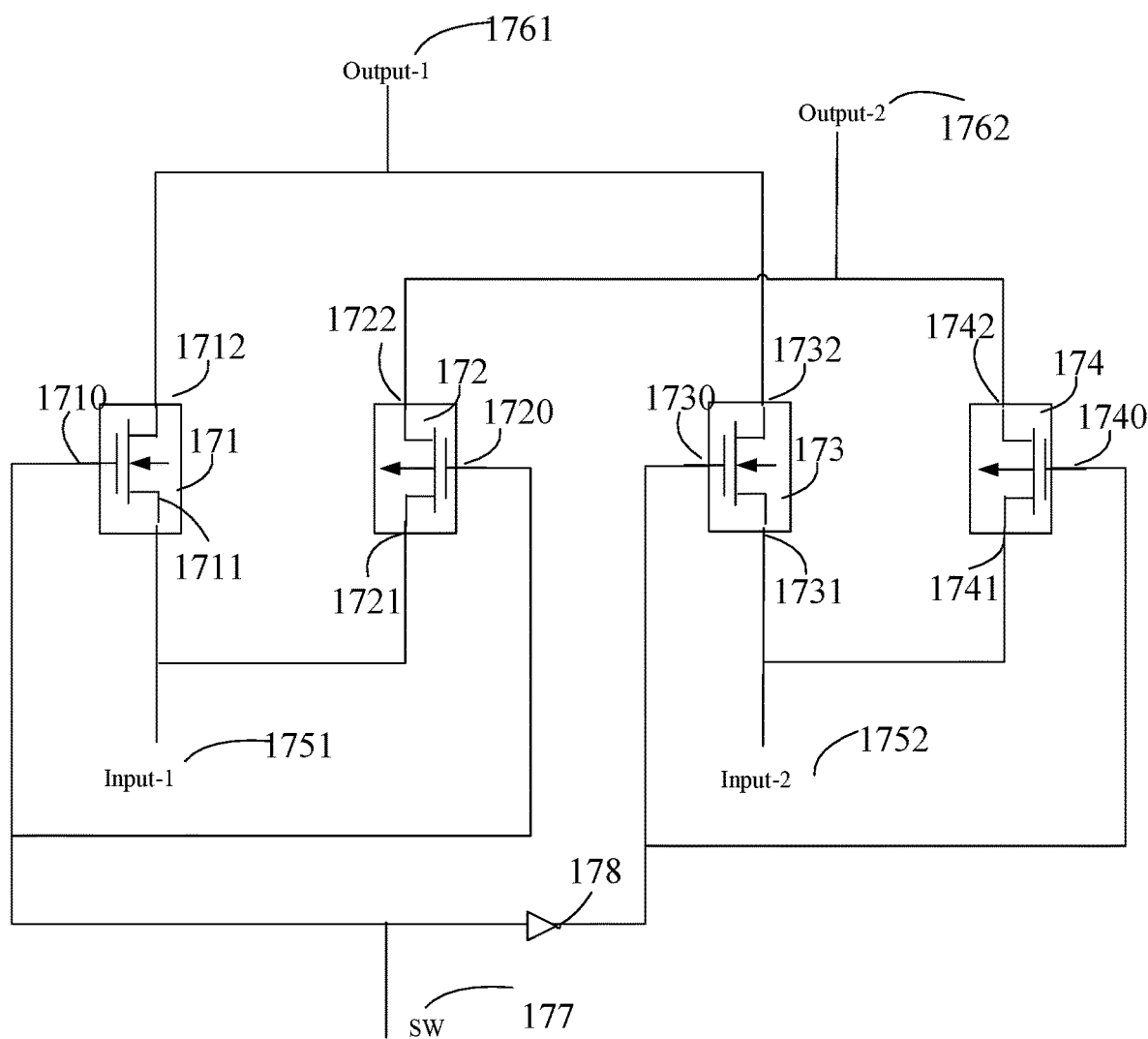
FIG. 17 is a schematic diagram of a structure of a conversion circuit according to yet another embodiment of the present disclosure.
Figure 18:
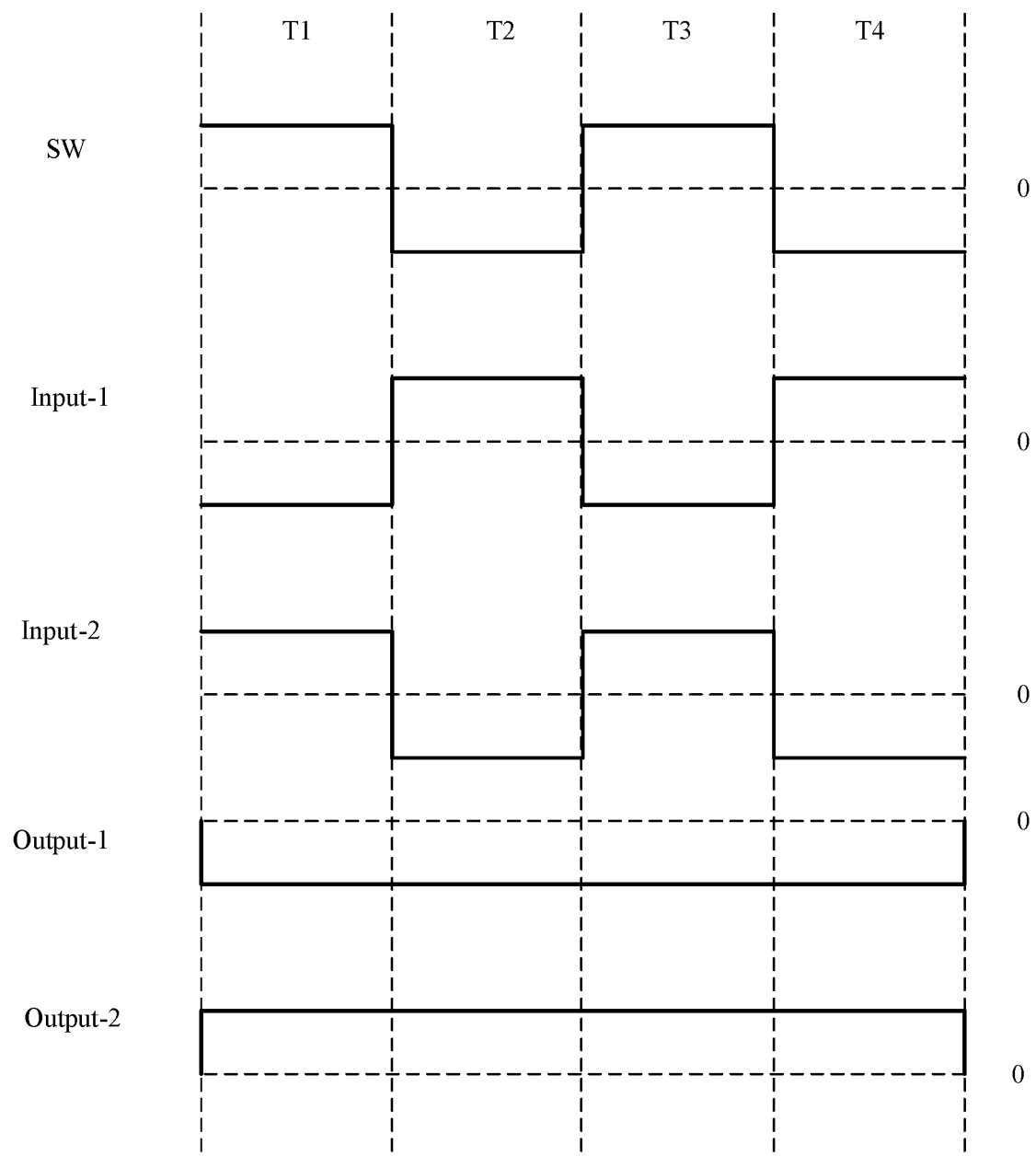
FIG. 18 is a time sequence diagram of an input/output signal at each terminal of the conversion circuit shown in FIG. 17.

FIG. 17 is a schematic diagram of a structure of a conversion circuit according to yet another embodiment of the present disclosure, and FIG. 18 is a time sequence diagram of an input/output signal at each terminal of the conversion circuit shown in FIG. 17.

With reference to FIG. 17, the first transistor, the second transistor, the third transistor, and the fourth transistor of the conversion circuit are respectively an NMOS transistor 171, a PMOS transistor 172, an NMOS transistor 173, and a PMOS transistor 174.

The first input terminal 1751 is connected to a first electrode 1711 of the NMOS transistor 171 and a first electrode 1721 of the PMOS transistor 172. The second input terminal 1752 is connected to a first electrode 1731 of the NMOS transistor 173 and a first electrode 1741 of the PMOS transistor 174.

The first output terminal 1761 is connected to a second electrode 1712 of the NMOS transistor 171 and a second electrode 1732 of the NMOS transistor 173. The second output terminal 1762 is connected to a second electrode 1722 of the PMOS transistor 172 and a second electrode 1732 of the PMOS transistor 173.

In this embodiment, the conversion circuit further includes a first waveform converter 178. The first waveform converter 178 has a terminal connected to the switch signal input terminal 177, and another terminal connected to the gate electrode 1730 of the NMOS transistor 173 and the gate electrode 1740 of the PMOS transistor 174. The first waveform converter 178 is configured to invert a level of the switch control signal received from the switch signal input terminal 177 and then transmit it to the gate electrode 1730 of the PMOS transistor 173 and the gate electrode 1740 of the NMOS transistor 174.

FIG. 18 is a time sequence diagram of signals at the switch signal input terminal 177, the first input terminal 1751, the second input terminal 1752, the first output terminal 1761 and the second output terminal 1762 of the conversion circuit shown in FIG. 17.

With reference to FIG. 17 and FIG. 18, during a period T1, the switch control signal received by the signal input terminal 177 is a high-level signal. Under control of the high-level signal, the NMOS transistor 171 and the PMOS transistor 174 are turned on, and the PMOS transistor 172 and the NMOS transistor 173 are turned off. In this case, the first input terminal 1751 is in communication with the first output terminal 1761, and the second input terminal 1752 is in communication with the second output terminal 1762. Thus, the first output signal outputted from the first output terminal 1761 and the first input signal have a same polarity, and the second output signal outputted from the second output terminal 1762 and the second input signal have a same polarity. As shown in FIG. 18, during the period T1, the first input signal is a low-level signal and the second input signal is a high-level signal, and thus the first output signal has the same polarity as the first input signal and is a low-level signal, and the second output signal has the same polarity as the second input signal and is a high-level signal.

During a period T2, the switch control signal received by the switch signal input terminal 177 is a low-level signal. Under control of the low-level signal, the NMOS transistor 171 and the PMOS transistor 174 are turned off, and the PMOS transistor 172 and the NMOS transistor 173 are turned on. In this case, the second input terminal 1752 is in communication with the first output terminal 1761, and the first input terminal 1751 is in communication with the second output terminal 1762. Thus, the first output signal outputted from the first output terminal 1761 and the second input signal have a same polarity, and the second output signal outputted from the second output terminal 1762 and the first input signal have a same polarity. As shown in FIG. 18, during the period T2, the first input signal is a high-level signal and the second input signal is a low-level signal, and thus the first output signal has the same polarity as the second input signal and is a low-level signal, and the second output signal has the same polarity as the first input signal and is a high-level signal.

Similarly, waveforms of signals of the switch signal input terminal 177, the first input terminal 1751, the second input terminal 1752, the first output terminal 1761, and the second output terminal 1762 during a period T3 are the same as those during the period T1. Therefore, during the period T3, the first output signal is a low-level signal, and the second output signal is a high-level signal.

Waveforms of signals of the switch signal input terminal 177, the first input terminal 1751, the second input terminal 1752, the first output terminal 1761, and the second output terminal 1762 during a period T4 are the same as those during the period T2. Therefore, during the period T4, the first output signal is a low-level signal, and the second output signal is a high-level signal.

It can be seen that during the periods T1-T4, although polarities of the first input signal and the second input signal received by the first input terminal 1751 and the second input terminal 1752 are different and alternately switch, each of the first output signal and the second output signal outputted from the first output terminal 1761 and the second output terminal 1762 has a constant polarity during any period. In this embodiment, the first output signal is always a low-level signal, and the second output signal is always a high-level signal.

Figure 19:
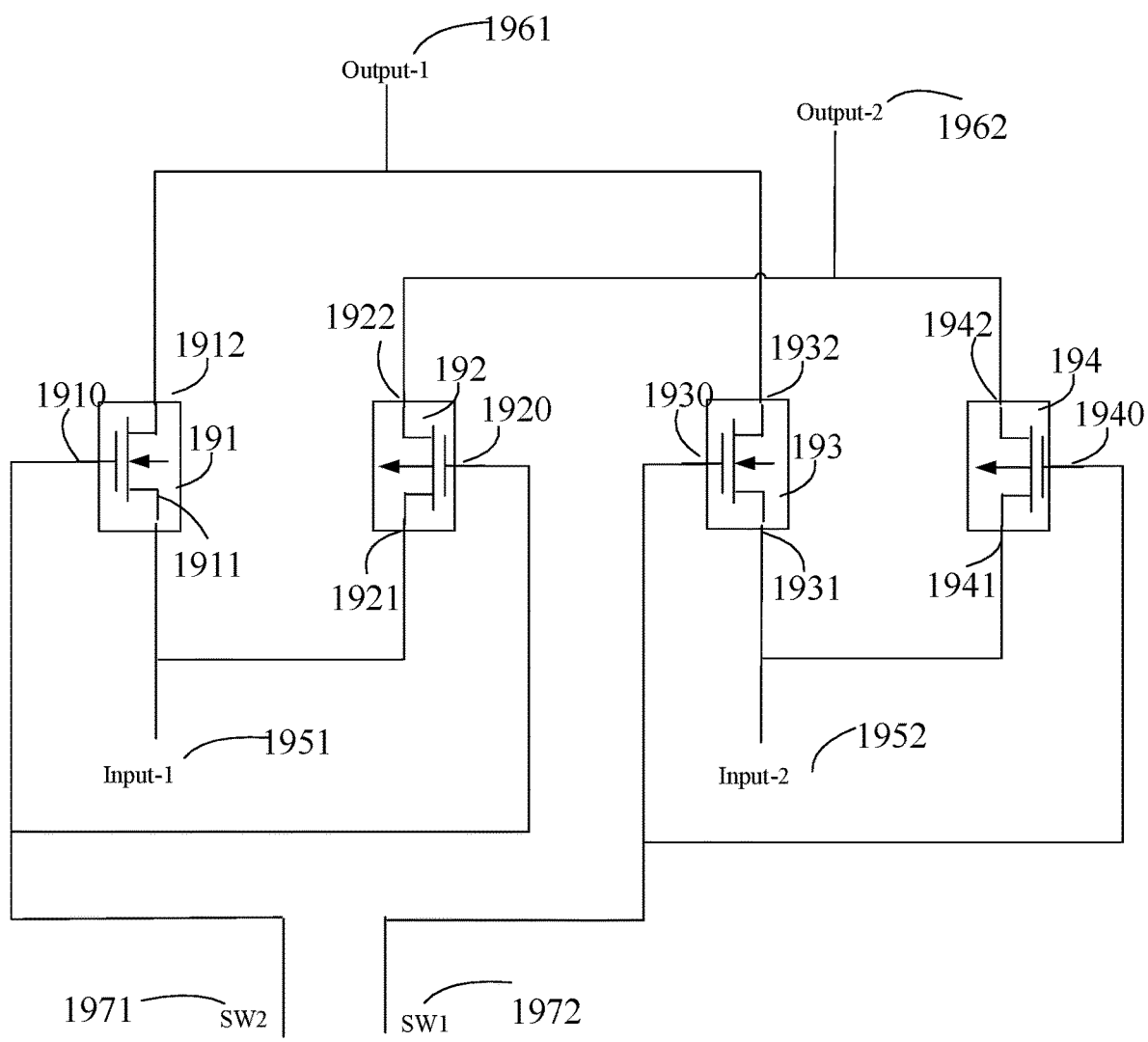
FIG. 19 is a schematic diagram of a structure of a conversion circuit according to yet another embodiment of the present disclosure.
Figure 20:
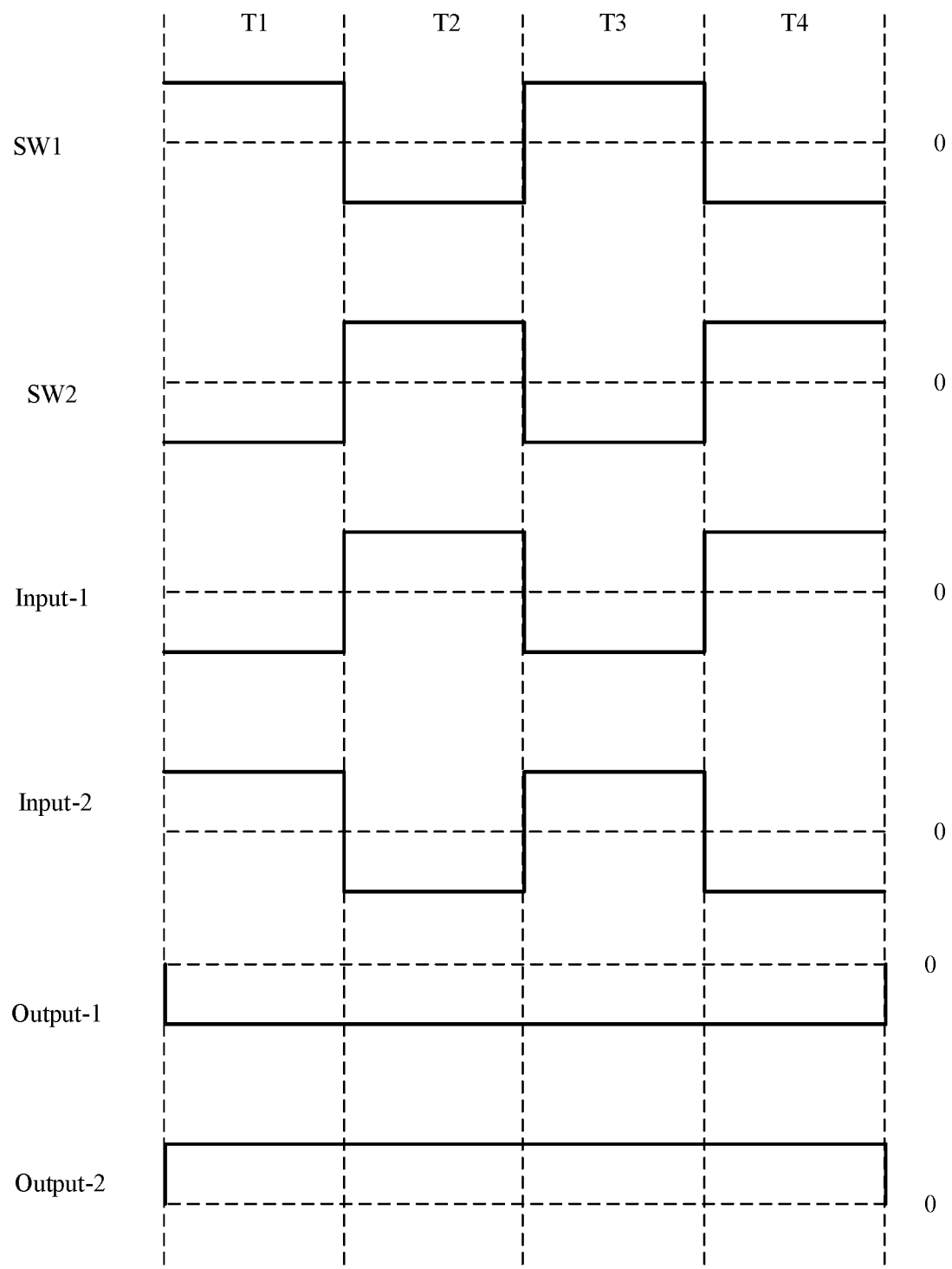
FIG. 20 is a time sequence diagram of an input/output signal at each terminal of the conversion circuit shown in FIG. 19.

FIG. 19 is a schematic diagram of a structure of a conversion circuit according to yet another embodiment of the present disclosure, and FIG. 20 is a time sequence diagram of an input/output signal at each terminal of the conversion circuit shown in FIG. 19.

With reference to FIG. 19, the first transistor, the second transistor, the third transistor, and the fourth transistor of the conversion circuit are respectively an NMOS transistor 191, a PMOS transistor 192, an NMOS transistor 193, and a PMOS transistor 194.

In this embodiment, a first switch signal input terminal 1971 and a second switch signal input terminal 1972 are provided. The first switch signal input terminal 1971 receives a first switch control signal, and the second switch signal input terminal 1972 receives the second switch control signal. The first switch control signal and the second switch control signal have opposite polarities. A gate electrode 1910 of the NMOS transistor 191 and a gate electrode 1920 of the PMOS transistor 192 are connected to the first switch signal input terminal 1971, and a gate electrode 1930 of the NMOS transistor 193 and a gate electrode 1940 of the PMOS transistor 194 are connected to the second switch signal input terminal 1972.

The first input terminal 1951 is connected to a first electrode 1911 of the NMOS transistor 191 and a first electrode 1921 of the PMOS transistor 192. The second input terminal 1952 is connected to a first electrode 1931 of the NMOS transistor 193 and a first electrode 1941 of the PMOS transistor 194.

The first output terminal 1961 is connected to a second electrode 1912 of the NMOS transistor 191 and a second electrode 1932 of the NMOS transistor 193. The second output terminal 1962 is connected to a second electrode 1922 of the PMOS transistor 192 and a second electrode 1942 of the PMOS transistor 194.

FIG. 20 is a time sequence diagram of signals at the first switch signal input terminal 1971, the second switch signal input terminal 1972, the first input terminal 1951, the second input terminal 1952, the first output terminal 1961 and the second output terminal 1962 of the conversion circuit shown in FIG. 19.

With reference to FIG. 19 and FIG. 20, during a period T1, the switch control signal received by the first switch signal input terminal 1971 is a high-level signal, and the switch control signal received by the second switch signal input terminal 1972 is a low-level signal. Therefore, the NMOS transistor 191 and the PMOS transistor 194 are turned on, and the PMOS transistor 192 and the NMOS transistor 193 are turned off. In this case, the first input terminal 1951 is in communication with the first output terminal 1961, and the second input terminal 1952 is in communication with the second output terminal 1962. Thus, the first output signal outputted from the first output terminal 1961 and the first input signal have a same polarity, and the second output signal outputted from the second output terminal 1962 and the second input signal have a same polarity. As shown in FIG. 20, during the period T1, the first input signal is a low-level signal and the second input signal is a high-level signal, and thus the first output signal has the same polarity as the first input signal and is a low-level signal, and the second output signal has the same polarity as the second input signal and is a high-level signal.

During a period T2, the switch control signal received by the first switch signal input terminal 1971 is a low-level signal, and the switch control signal received by the second switch signal input terminal 1972 is a high-level signal. Therefore, the NMOS transistor 191 and the PMOS transistor 194 are turned off, and the PMOS transistor 192 and the NMOS transistor 193 are turned on. In this case, the second input terminal 1952 is in communication with the first output terminal 1961, and the first input terminal 1951 is in communication with the second output terminal 1962. Thus, the first output signal outputted from the first output terminal 1961 and the second input signal have a same polarity, and the second output signal outputted from the second output terminal 1962 and the first input signal have a same polarity. As shown in FIG. 20, during the period T2, the first input signal is a high-level signal and the second input signal is a low-level signal, and thus the first output signal has the same polarity as the second input signal and is a low-level signal, and the second output signal has the same polarity as the first input signal and is a high-level signal.

Similarly, waveforms of signals of the first switch signal input terminal 1971, the second switch signal input terminal 1972, the first input terminal 1951, the second input terminal 1952, the first output terminal 1961, and the second output terminal 1962 during a period T3 are the same as those during the period T1. Therefore, during the period T3, the first output signal is a low-level signal, and the second output signal is a high-level signal.

Waveforms of signals of the first switch signal input terminal 1971, the second switch signal input terminal 1972, the first input terminal 1951, the second input terminal 1952, the first output terminal 1961, and the second output terminal 1962 during a period T4 are the same as those during the period T2. Therefore, during the period T4, the first output signal is a low-level signal, and the second output signal is a high-level signal.

It can be seen that during the periods T1-T4, although polarities of the first input signal and the second input signal received by the first input terminal 1951 and the second input terminal 1952, each of the first output signal and the second output signal outputted from the first output terminal 1961 and the second output terminal 1962 has a constant polarity during any period. In this embodiment, the first output signal is always a low-level signal, and the second output signal is always a high-level signal.

Figure 21:
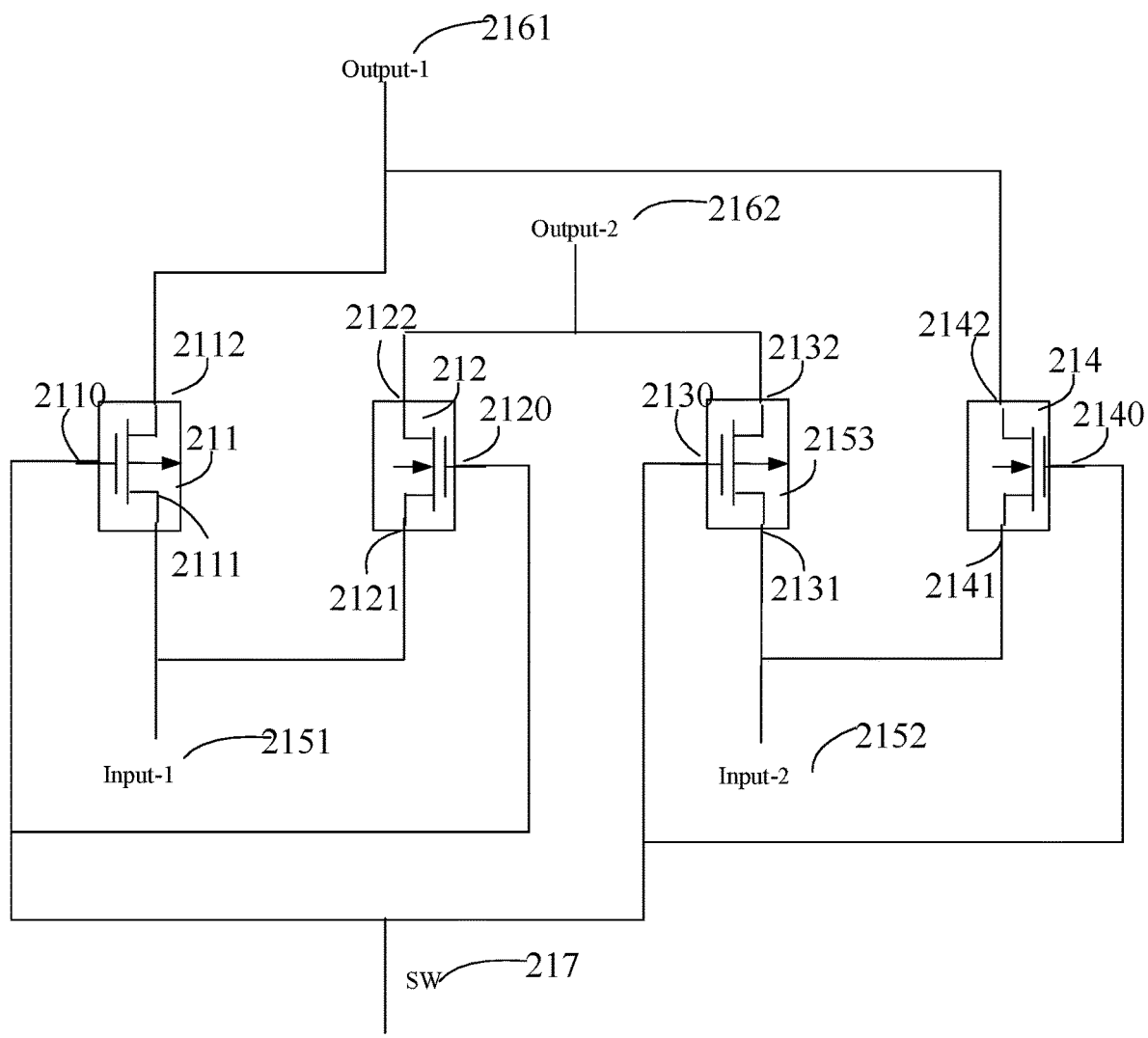
FIG. 21 is a schematic diagram of a structure of a conversion circuit according to yet another embodiment of the present disclosure.
Figure 22:
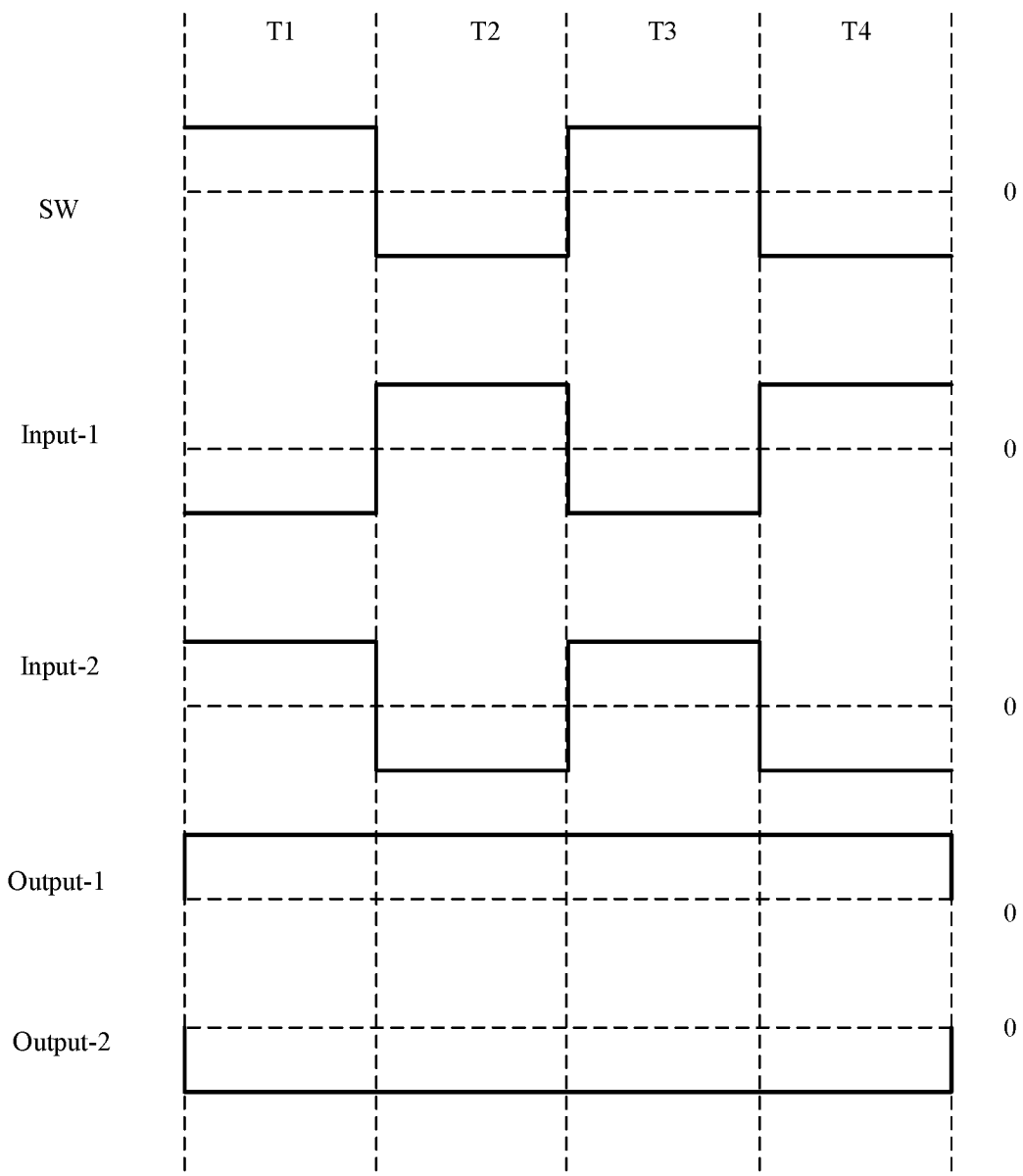
FIG. 22 is a time sequence diagram of an input/output signal at each terminal of the conversion circuit shown in FIG. 21.

FIG. 21 is a schematic diagram of a structure of a conversion circuit according to yet another embodiment of the present disclosure, and FIG. 22 is a time sequence diagram of an input/output signal at each terminal of the conversion circuit shown in FIG. 21.

With reference to FIG. 21, the first transistor, the second transistor, the third transistor, and the fourth transistor of the conversion circuit are respectively a PMOS transistor 211, an NMOS transistor 212, a PMOS transistor 213, and an NMOS transistor 214. A gate electrode 2110 of the PMOS transistor 211, a gate electrode 2120 of the NMOS transistor 2152, a gate electrode 2130 of the PMOS transistor 213, and a gate electrode 2140 of the NMOS transistor 214 are connected to a switch signal input terminal 217.

The first input terminal 2151 is connected to a first electrode 2111 of the PMOS transistor 211 and a first electrode 2121 of the NMOS transistor 212. The second input terminal 2152 is connected to a first electrode 2131 of the PMOS transistor 213 and a first electrode 2141 of the NMOS transistor 214.

The first output terminal 2161 is connected to a second electrode 2112 of the PMOS transistor 211 and a second electrode 2142 of the NMOS transistor 214. The second output terminal 2162 is connected to a second electrode 2122 of the PMOS transistor 212 and a second electrode 2132 of the NMOS transistor 213.

FIG. 22 is a time sequence diagram of signals at the switch signal input terminal 217, the first input terminal 2151, the second input terminal 2152, the first output terminal 2161 and the second output terminal 2162 of the conversion circuit shown in FIG. 21.

With reference to FIG. 21 and FIG. 22, during a period T1, the switch control signal received by the switch signal input terminal 217 is a high-level signal. Under control of the high-level signal, the NMOS transistor 212 and the NMOS transistor 214 are turned on, and the PMOS transistor 211 and the PMOS transistor 213 are turned off. In this case, the first input terminal 2151 is in communication with the second output terminal 2162, and the second input terminal 2152 is in communication with the first output terminal 2161. Thus, the first output signal outputted from the first output terminal 2161 and the second input signal have a same polarity, and the second output signal outputted from the second output terminal 2162 and the first input signal have a same polarity. As shown in FIG. 22, during the period T1, the first input signal is a low-level signal and the second input signal is a high-level signal, and thus the first output signal has the same polarity as the second input signal and is a high-level signal, and the second output signal has the same polarity as the first input signal and is a low-level signal.

During a period T2, the switch control signal received by the switch signal input terminal 217 is a low-level signal. Under control of the low-level signal, the NMOS transistor 212 and the NMOS transistor 214 are turned off, and the PMOS transistor 211 and the PMOS transistor 213 are turned on. In this case, the first input terminal 2151 is in communication with the first output terminal 2161, and the second input terminal 2152 is communication with the second output terminal 2162. Thus, the first output signal outputted from the first output terminal 2161 and the first input signal have a same polarity, and the second output signal outputted from the second output terminal 2162 and the second input signal have a same polarity. As shown in FIG. 22, during the period T2, the first input signal is a high-level signal and the second input signal is a low-level signal, and thus the first output signal has the same polarity as the first input signal and is a high-level signal, and the second output signal has the same polarity as the second input signal and is a low-level signal.

Similarly, waveforms of signals of the switch signal input terminal 217, the first input terminal 2151, the second input terminal 2152, the first output terminal 2161, and the second output terminal 2162 during a period T3 are the same as those during the period T1. Therefore, during the period T3, the first output signal is a low-level signal, and the second output signal is a high-level signal.

Waveforms of signals of the switch signal input terminal 217, the first input terminal 2151, the second input terminal 2152, the first output terminal 2161, and the second output terminal 2162 during a period T4 are the same as those during the period T2. Therefore, during the period T4, the first output signal is a low-level signal, and the second output signal is a high-level signal.

It can be seen that during the periods T1-T4, although polarities of the first input signal and the second input signal received by the first input terminal 2151 and the second input terminal 2152 are different and alternately switch, each of the first output signal and the second output signal outputted from the first output terminal 2161 and the second output terminal 2162 has a constant polarity during any period. In this embodiment, the first output signal is always a low-level signal, and the second output signal is always a high-level signal.

Figure 23:
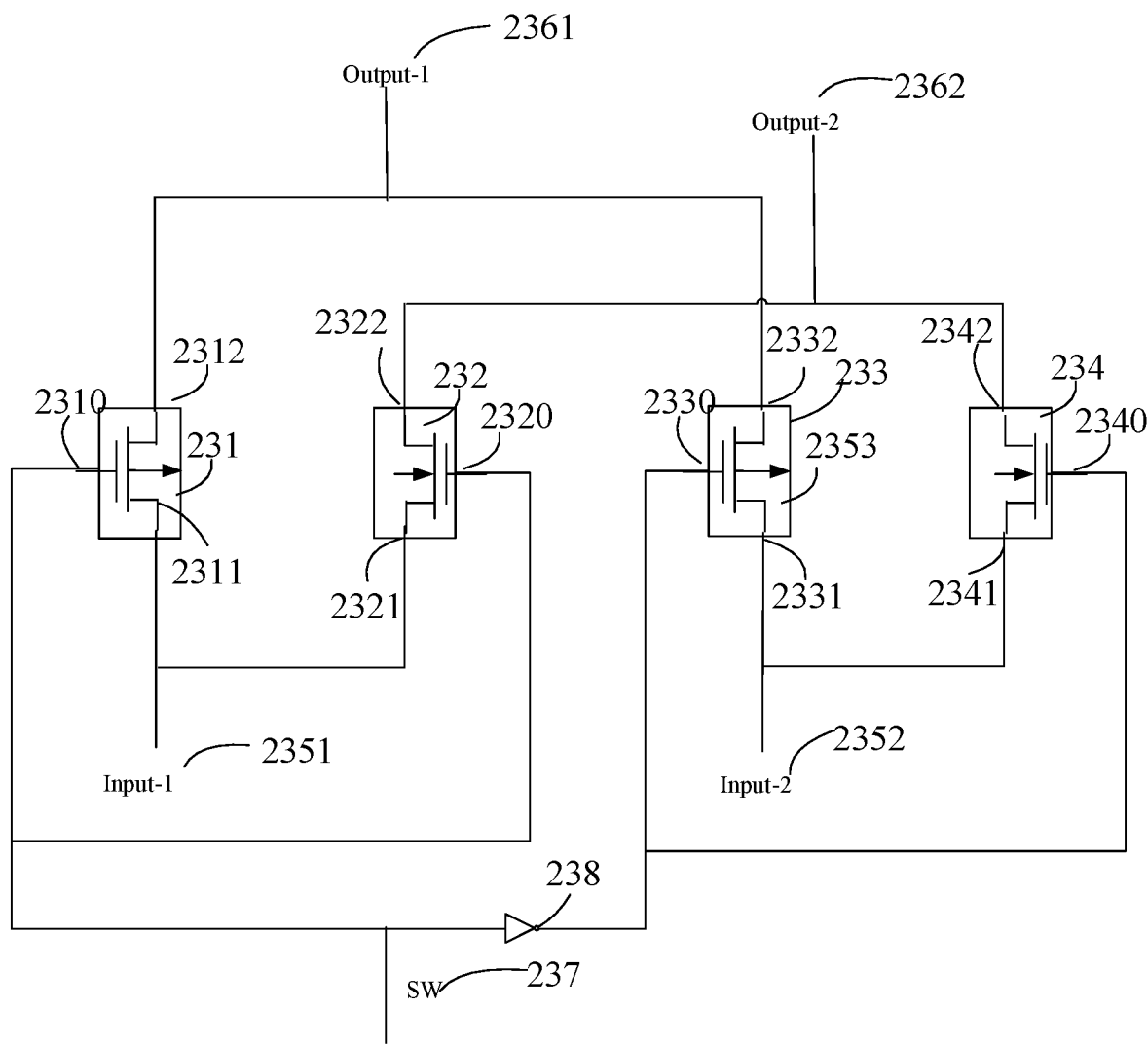
FIG. 23 is a schematic diagram of a structure of a conversion circuit according to yet another embodiment of the present disclosure.
Figure 24:
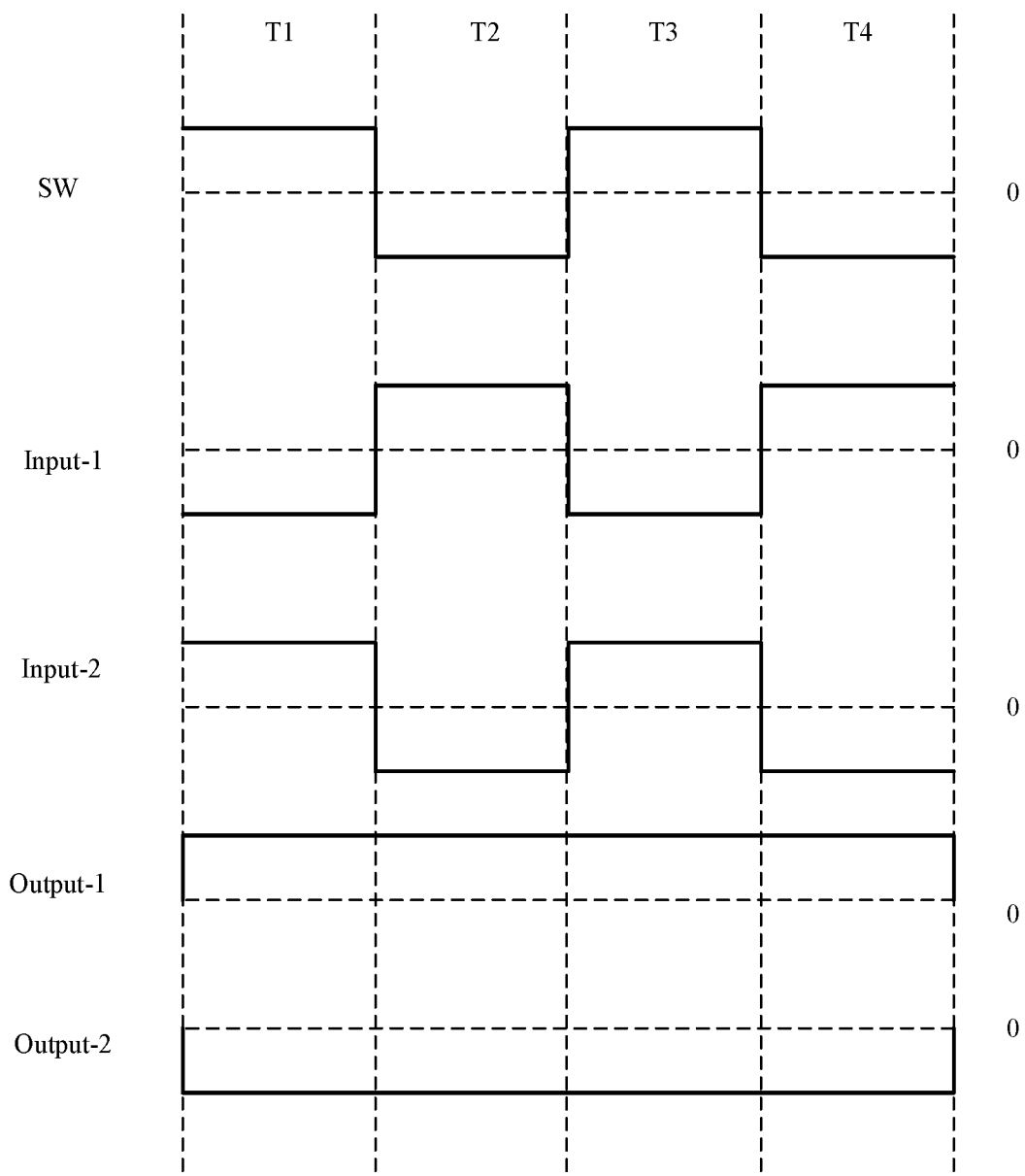
FIG. 24 is a time sequence diagram of an input/output signal at each terminal of the conversion circuit shown in FIG. 23.

FIG. 23 is a schematic diagram of a structure of a conversion circuit according to yet another embodiment of the present disclosure, and FIG. 24 is a time sequence diagram of an input/output signal at each terminal of the conversion circuit shown in FIG. 23.

With reference to FIG. 23, the first transistor, the second transistor, the third transistor, and the fourth transistor of the conversion circuit are respectively a PMOS transistor 231, an NMOS transistor 232, a PMOS transistor 233, and an NMOS transistor 234.

The first input terminal 2351 is connected to a first electrode 2311 of the PMOS transistor 231 and a first electrode 2321 of the NMOS transistor 232. The second input terminal 2352 is connected to a first electrode 2331 of the PMOS transistor 233 and a first electrode 2341 of the NMOS transistor 234.

The first output terminal 2361 is connected to a second electrode 2312 of the PMOS transistor 231 and a second electrode 2332 of the PMOS transistor 233. The second output terminal 2362 is connected to a second electrode 2322 of the NMOS transistor 232 and a second electrode 2342 of the NMOS transistor 234.

In this embodiment, the conversion circuit further includes a first waveform converter 238. The first waveform converter 238 has a terminal connected to the switch signal input terminal 237, and another terminal connected to the gate electrode 2330 of the PMOS transistor 233 and the gate electrode 2340 of the NMOS transistor 234. The first waveform converter 238 is configured to invert a level of the switch control signal received from the switch signal input terminal 237 and then transmit it to the gate electrode 2330 of the PMOS transistor 233 and the gate electrode 2340 of the NMOS transistor 234.

FIG. 24 is a time sequence diagram of signals at the switch signal input terminal 237, the first input terminal 2351, the second input terminal 2352, the first output terminal 2361 and the second output terminal 2362 of the conversion circuit shown in FIG. 23.

With reference to FIG. 23 and FIG. 24, during a period T1, the switch control signal received by the switch signal input terminal 237 is a high-level signal. Under control of the high-level signal, the NMOS transistor 232 and the PMOS transistor 233 are turned on, and the PMOS transistor 231 and the NMOS transistor 234 are turned off. In this case, the first input terminal 2351 is in communication with the second output terminal 2362, and the second input terminal 2352 is in communication with the first output terminal 2361. Thus, the first output signal outputted from the first output terminal 2361 and the second input signal have a same polarity, and the second output signal outputted from the second output terminal 2362 and the first input signal have a same polarity. As shown in FIG. 24, during the period T1, the first input signal is a low-level signal and the second input signal is a high-level signal, and thus the first output signal has the same polarity as the second input signal and is a high-level signal, and the second output signal has the same polarity as the first input signal and is a low-level signal.

During a period T2, the switch control signal received by the switch signal input terminal 237 is a low-level signal. Under control of the low-level signal, the NMOS transistor 232 and the PMOS transistor 233 are turned off, and the PMOS transistor 231 and the NMOS transistor 234 are turned on. In this case, the second input terminal 2352 is in communication with the second output terminal 2361, and the first input terminal 2351 is in communication with the second output terminal 2362. Thus, the first output signal outputted from the first output terminal 2361 and the first input signal have a same polarity, and the second output signal outputted from the second output terminal 2362 and the second input signal have a same polarity. As shown in FIG. 24, during the period T2, the first input signal is a high-level signal and the second input signal is a low-level signal, and thus the first output signal that the same polarity as the first input signal and is a high-level signal, and the second output signal has the polarity as the second input signal and is a low-level signal.

Similarly, waveforms of signals of the switch signal input terminal 237, the first input terminal 2351, the second input terminal 2352, the first output terminal 2361, and the second output terminal 2362 during a period T3 are the same as those during the period T1. Therefore, during the period T3, the first output signal is a high-level signal, and the second output signal is a low-level signal.

Waveforms of signals of the switch signal input terminal 237, the first input terminal 2351, the second input terminal 2352, the first output terminal 2361, and the second output terminal 2362 during a period T4 are the same as those during the period T2. Therefore, during the period T4, the first output signal is a high-level signal, and the second output signal is a low-level signal.

It can be seen that during the periods T1-T4, although polarities of the first input signal and the second input signal received by the first input terminal 2351 and the second input terminal 2352 are different and alternately switch, each of the first output signal and the second output signal outputted from the first output terminal 2361 and the second output terminal 2362 has a constant polarity during any period. In this embodiment, the first output signal is always a high-level signal, and the second output signal is always a low-level signal.

Figure 25:
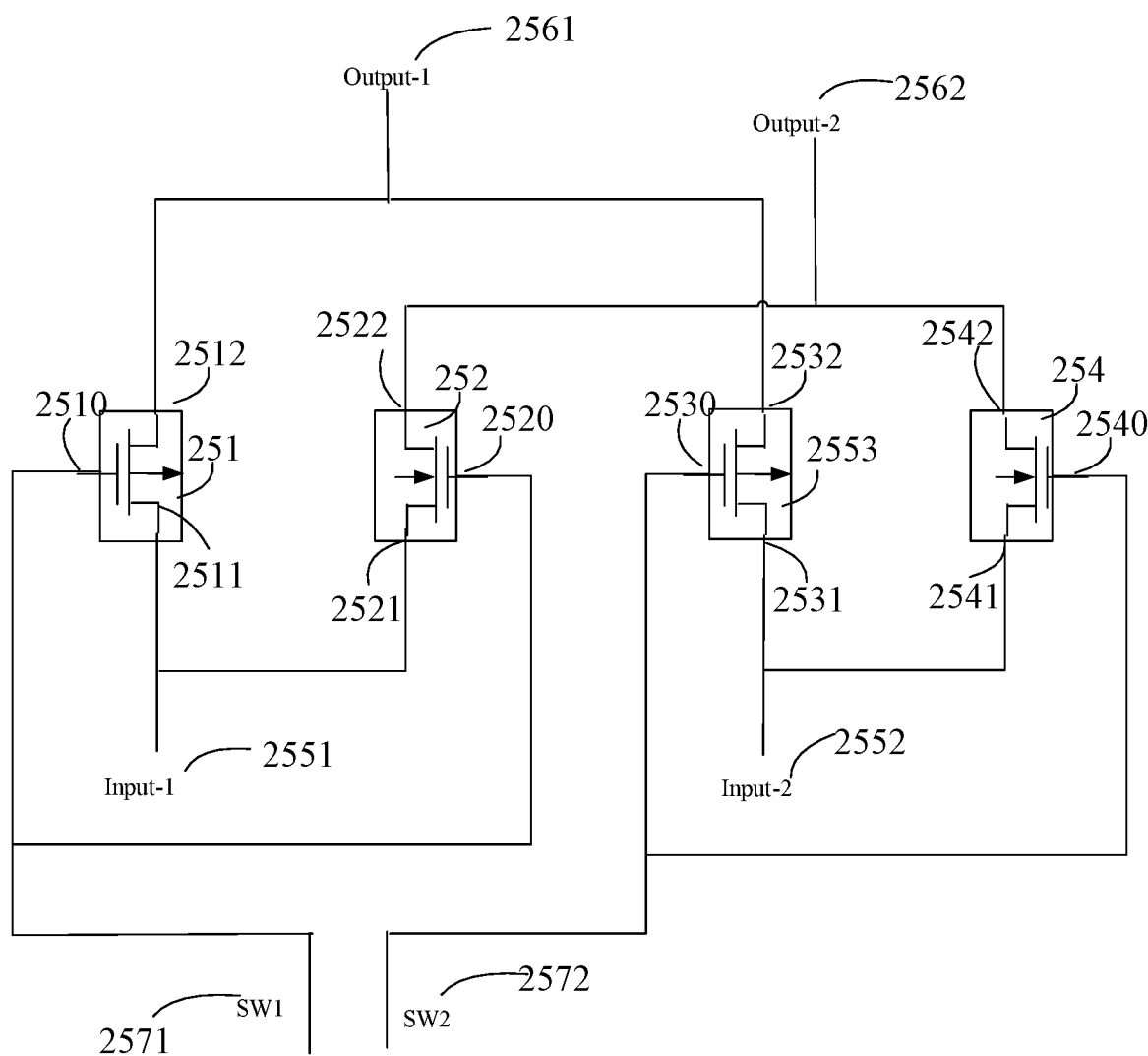
FIG. 25 is a schematic diagram of a structure of a conversion circuit according to yet another embodiment of the present disclosure.
Figure 26:
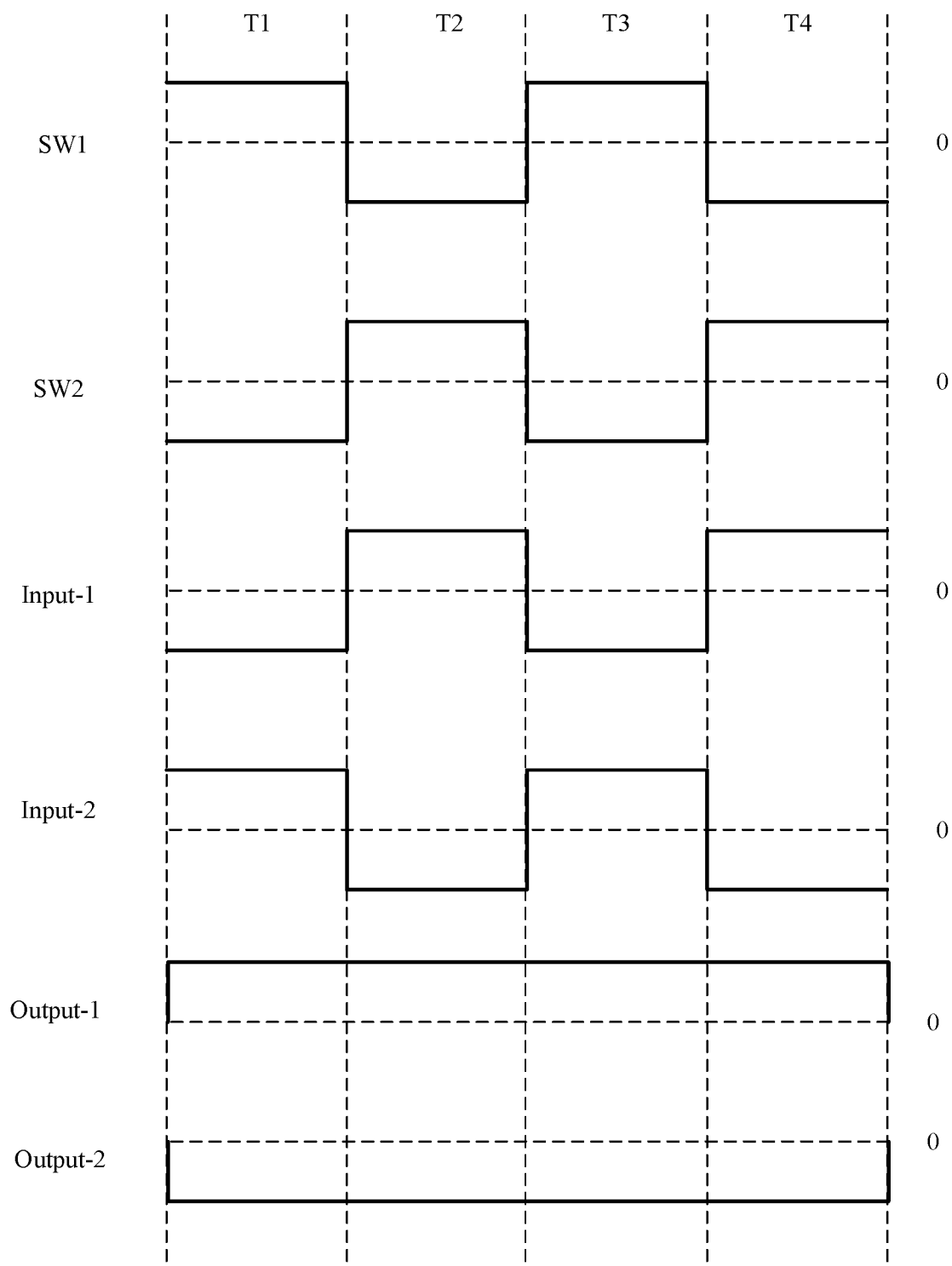
FIG. 26 is a time sequence diagram of an input/output signal at each terminal of the conversion circuit shown in FIG. 25.

FIG. 25 is a schematic diagram of a structure of a conversion circuit according to yet another embodiment of the present disclosure, and FIG. 26 is a time sequence diagram of an input/output signal at each terminal of the conversion circuit shown in FIG. 25.

With reference to FIG. 25, the first transistor, the second transistor, the third transistor, and the fourth transistor of the conversion circuit are respectively a PMOS transistor 251, an NMOS transistor 252, a PMOS transistor 253, and an NMOS transistor 254.

In this embodiment, a first switch signal input terminal 2571 and a second switch signal input terminal 2572 are provided. The first switch signal input terminal 2571 receives a first switch control signal, and the second switch signal input terminal 2572 receives a second switch control signal. The first switch control signal and the second switch control signal have opposite waveforms. A gate electrode 2510 of the PMOS transistor 251 and a gate electrode 2520 of the NMOS transistor 252 are connected to the first switch signal input terminal 2571, and a gate electrode 2530 of the PMOS transistor 253 and a gate electrode 2540 of the NMOS transistor 254 are connected to the second switch signal input terminal 2572.

The first input terminal 2551 is connected to a first electrode 2511 of the PMOS transistor 251 and a first electrode 2521 of the NMOS transistor 252. The second input terminal 2552 is connected to a first electrode 2531 of the PMOS transistor 253 and a first electrode 2541 of the NMOS transistor 254.

The first output terminal 2561 is connected to a second electrode 2512 of the PMOS transistor 251 and a second electrode 2532 of the PMOS transistor 253. The second output terminal 2562 is connected to a second electrode 2522 of the NMOS transistor 252 and a second electrode 2542 of the NMOS transistor 254.

FIG. 26 is a time sequence diagram of signals at the first switch signal input terminal 2571, the second switch signal input terminal 2572, the first input terminal 2551, the second input terminal 2552, the first output terminal 2561 and the second output terminal 2562 of the conversion circuit shown in FIG. 25.

With reference to FIG. 25 and FIG. 26, during a period T1, the switch control signal received by the first switch signal input terminal 2571 is a high-level signal, and the switch control signal received by the second switch signal input terminal 2572 is a low-level signal. Therefore, the NMOS transistor 252 and the PMOS transistor 253 are turned on, and the PMOS transistor 251 and the NMOS transistor 254 are turned off. In this case, the first input terminal 2551 is in communication with the second output terminal 2562, and the second input terminal 2552 is in communication with the first output terminal 2561. Thus, the first output signal outputted from the first output terminal 2561 and the second input signal have a same polarity, and the second output signal outputted from the second output terminal 2562 and the first input signal have a same polarity. As shown in FIG. 26, during the period T1, the first input signal is a low-level signal and the second input signal is a high-level signal, and thus the first output signal has the same polarity as the second input signal and is a high-level signal, and the second output signal has the same polarity as the first input signal and is a low-level signal.

During a period T2, the switch control signal received by the first switch signal input terminal 2571 is a low-level signal, and the switch control signal received by the second switch signal input terminal 2572 is a high-level signal. Therefore, the NMOS transistor 252 and the PMOS transistor 253 are turned off, and the PMOS transistor 251 and the NMOS transistor 254 are turned on. In this case, the second input terminal 2552 is in communication with the second output terminal 2562, and the first input terminal 2551 is in communication with the first output terminal 2562. Thus, the first output signal outputted from the first output terminal 2561 and the first input signal has a same polarity, and the second output signal outputted from the second output terminal 2562 and the second input signal have a same polarity. As shown in FIG. 26, during the period T2, the first input signal is a high-level signal and the second input signal is a low-level signal, and thus the first output signal has the same polarity as the first input signal and is a high-level signal, and the second output signal has the same polarity as the first input signal and is a low-level signal.

Similarly, waveforms of signals of the first switch signal input terminal 2571, the second switch signal input terminal 2572, the first input terminal 2551, the second input terminal 2552, the first output terminal 2561, and the second output terminal 2562 during a period T3 are the same as those during the period T1. Therefore, during the period T3, the first output signal is a high-level signal, and the second output signal is a low-level signal.

Waveforms of signals of the first switch signal input terminal 2571, the second switch signal input terminal 2572, the first input terminal 2551, the second input terminal 2552, the first output terminal 2561, and the second output terminal 2562 during a period T4 are the same as those during the period T2. Therefore, during the period T4, the first output signal is a high-level signal, and the second output signal is a low-level signal.

It can be seen that during the periods T1-T4, although polarities of the first input signal and the second input signal received by the first input terminal 2551 and the second input terminal 2552, each of the first output signal and the second output signal outputted from the first output terminal 2561 and the second output terminal 2562 has a constant polarity during any period. In this embodiment, the first output signal is always a high-level signal, and the second output signal is always a low-level signal.

Figure 27:
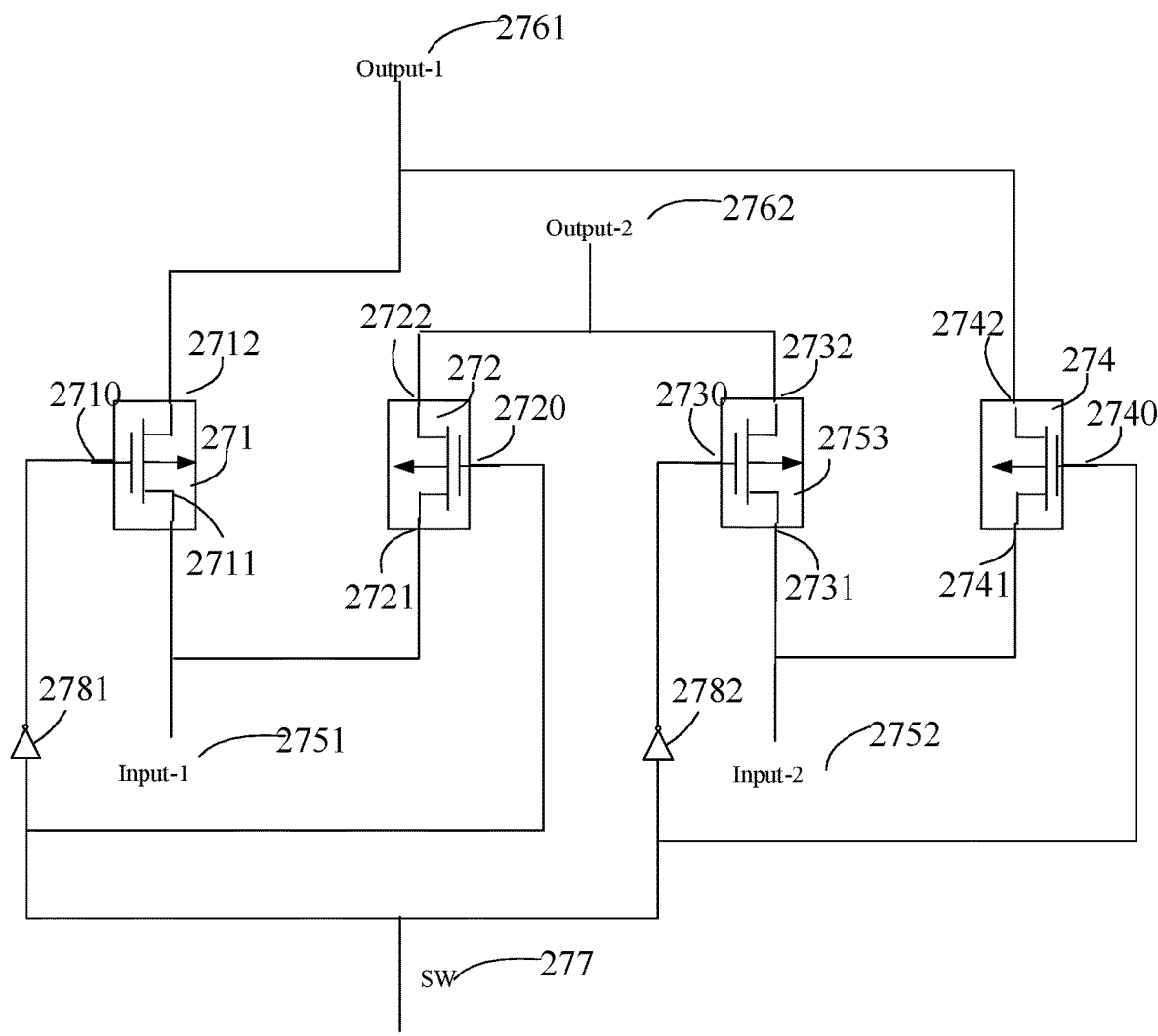
FIG. 27 is a schematic diagram of a structure of a conversion circuit according to yet another embodiment of the present disclosure.
Figure 28:
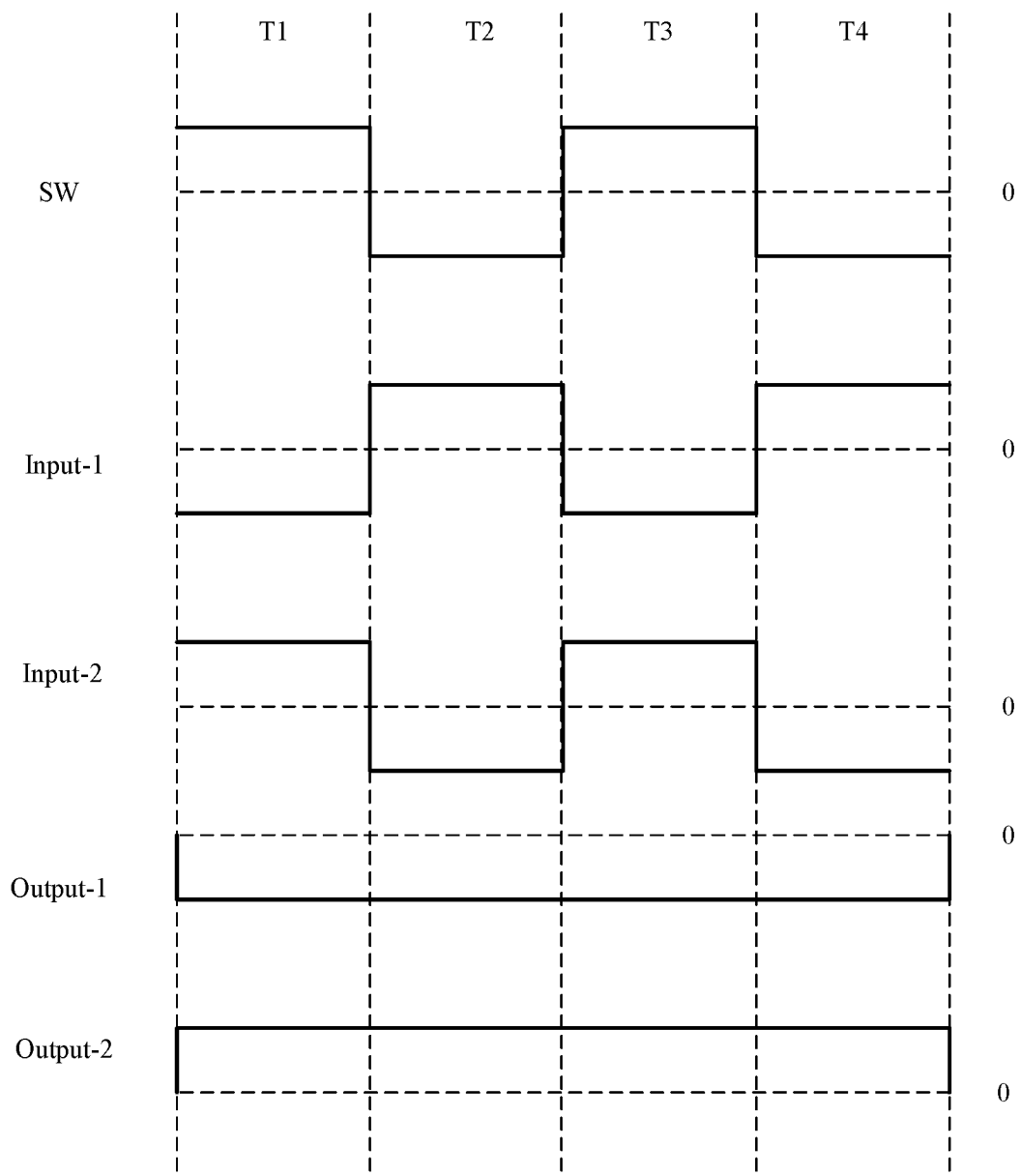
FIG. 28 is a time sequence diagram of an input/output signal at each terminal of the conversion circuit shown in FIG. 27.

FIG. 27 is a schematic diagram of a structure of a conversion circuit according to yet another embodiment of the present disclosure, and FIG. 28 is a time sequence diagram of an input/output signal at each terminal of the conversion circuit shown in FIG. 27.

With reference to FIG. 27, the first transistor, the second transistor, the third transistor, and the fourth transistor of the conversion circuit are respectively a PMOS transistor 271, a PMOS transistor 272, a PMOS transistor 273, and a PMOS transistor 274.

The conversion circuit further includes a second waveform converter 2781 and a third waveform converter 2782. The second waveform converter 2781 has a terminal connected to a gate electrode 2710 of the PMOS transistor 271, and another terminal connected to the switch signal input terminal 277. The third waveform converter 2782 has a terminal connected to a gate electrode 2730 of the PMOS transistor 273, and another terminal connected to the switch signal input terminal 277. The gate electrode 2720 of the PMOS transistor 272 and a gate electrode 2740 of the PMOS transistor 274 are connected to the switch signal input terminal 277.

The first input terminal 2751 is connected to a first electrode 2711 of the PMOS transistor 271 and a first electrode 2721 of the PMOS transistor 272. The second input terminal 2752 is connected to a first electrode 2731 of the PMOS transistor 2753 and a first electrode 2741 of the PMOS transistor 274.

The first output terminal 2761 is connected to a second electrode 2712 of the PMOS transistor 271 and a second electrode 2742 of the PMOS transistor 274. The second output terminal 2762 is connected to a second electrode 2722 of the PMOS transistor 272 and a second electrode 2732 of the PMOS transistor 273.

FIG. 28 is a time sequence diagram of signals at the switch signal input terminal 277, the first input terminal 2751, the second input terminal 2752, the first output terminal 2761 and the second output terminal 2762 of the conversion circuit shown in FIG. 27.

With reference to FIG. 27 and FIG. 28, during a period T1, the switch control signal received by the switch signal input terminal 277 is a high-level signal. Under control of the high-level signal, the PMOS transistor 271 and the PMOS transistor 273 are turned on, and the PMOS transistor 272 and the PMOS transistor 274 are turned off. In this case, the first input terminal 2751 is in communication with the first output terminal 2761, and the second input terminal 2752 is in communication with the second output terminal 2762. Thus, the first output signal outputted from the first output terminal 2761 and the first input signal have a same polarity, and the second output signal outputted from the second output terminal 2762 and the second input signal have a same polarity. As shown in FIG. 28, during the period T1, the first input signal is a low-level signal and the second input signal is a high-level signal, and thus the first output signal has the same polarity as the first input signal and is a low-level signal, and the second output signal has the same polarity as the second input signal and is a high-level signal.

During a period T2, the switch control signal received by the switch signal input terminal 277 is a low-level signal. Under control of the low-level signal, the PMOS transistor 271 and the PMOS transistor 273 are turned off, and the PMOS transistor 272 and the PMOS transistor 274 are turned on. In this case, the first input terminal 2751 is in communication with the second output terminal 2762, and the second input terminal 2752 is in communication with the first output terminal 2761. Thus, the first output signal outputted from the first output terminal 2761 and the second input signal have a same polarity, and the second output signal outputted from the second output terminal 2762 and the first input signal have a same polarity. As shown in FIG. 28, during the period T2, the first input signal is a high-level signal and the second input signal is a low-level signal, and thus the first output signal has the same polarity as the second input signal and is a low-level signal, and the second output signal has the same polarity as the first input signal and is a high-level signal.

Similarly, waveforms of signals of the switch signal input terminal 277, the first input terminal 2751, the second input terminal 2752, the first output terminal 2761, and the second output terminal 2762 during a period T3 are the same as those during the period T1. Therefore, during the period T3, the first output signal is a low-level signal, and the second output signal is a high-level signal.

Waveforms of signals of the switch signal input terminal 277, the first input terminal 2751, the second input terminal 2752, the first output terminal 2761, and the second output terminal 2762 during a period T4 are the same as those during the period T2. Therefore, during the period T4, the first output signal is a low-level signal, and the second output signal is a high-level signal.

It can be seen that during the periods T1-T4, although polarities of the first input signal and the second input signal received by the first input terminal 2751 and the second input terminal 2752 are different and alternately switch, each of the first output signal and the second output signal outputted from the first output terminal 2761 and the second output terminal 2762 has a constant polarity during any period. In this embodiment, the first output signal is always a low-level signal, and the second output signal is always a high-level signal.

Figure 29:
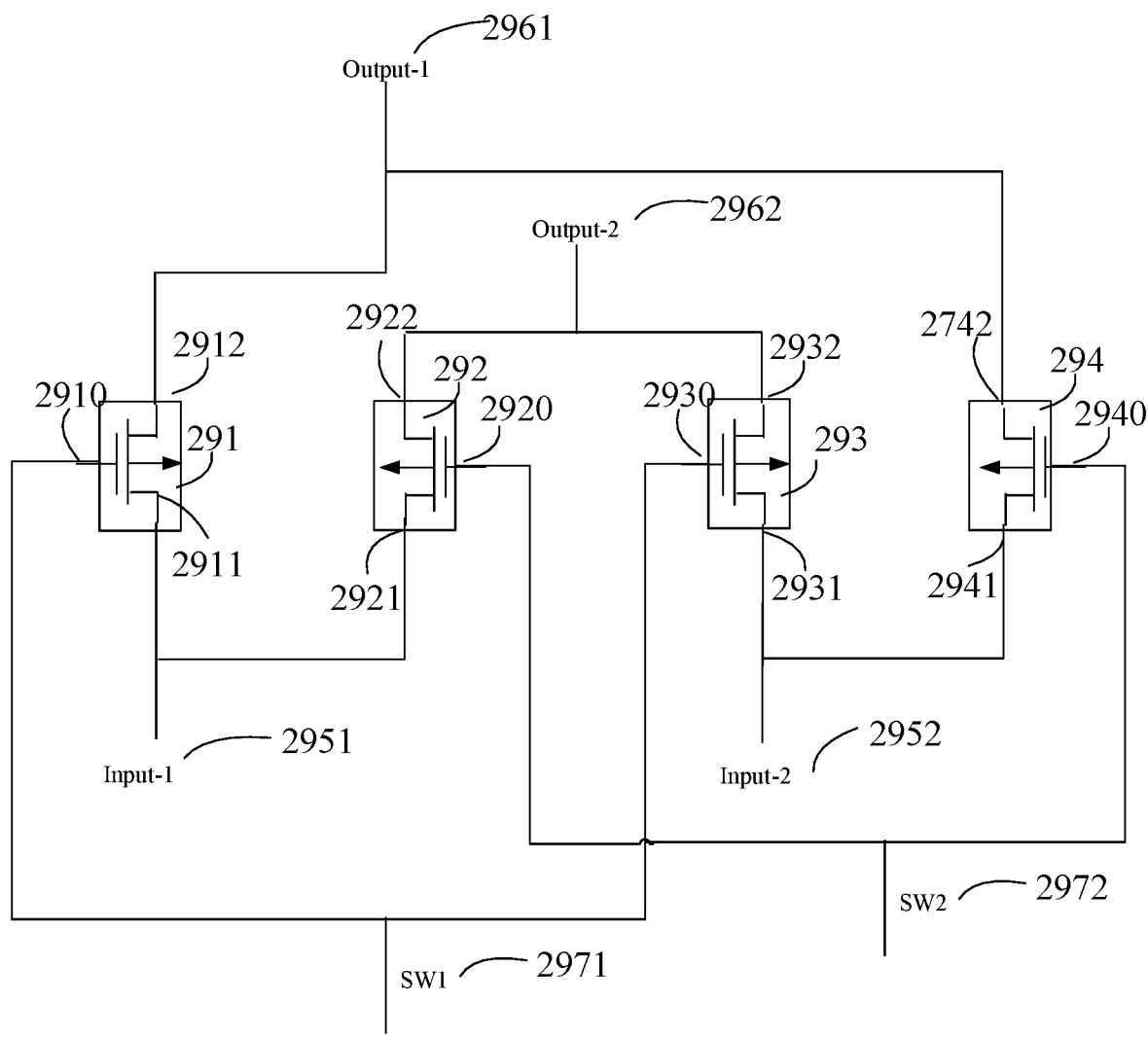
FIG. 29 is a schematic diagram of a structure of a conversion circuit according to yet another embodiment of the present disclosure.
Figure 30:
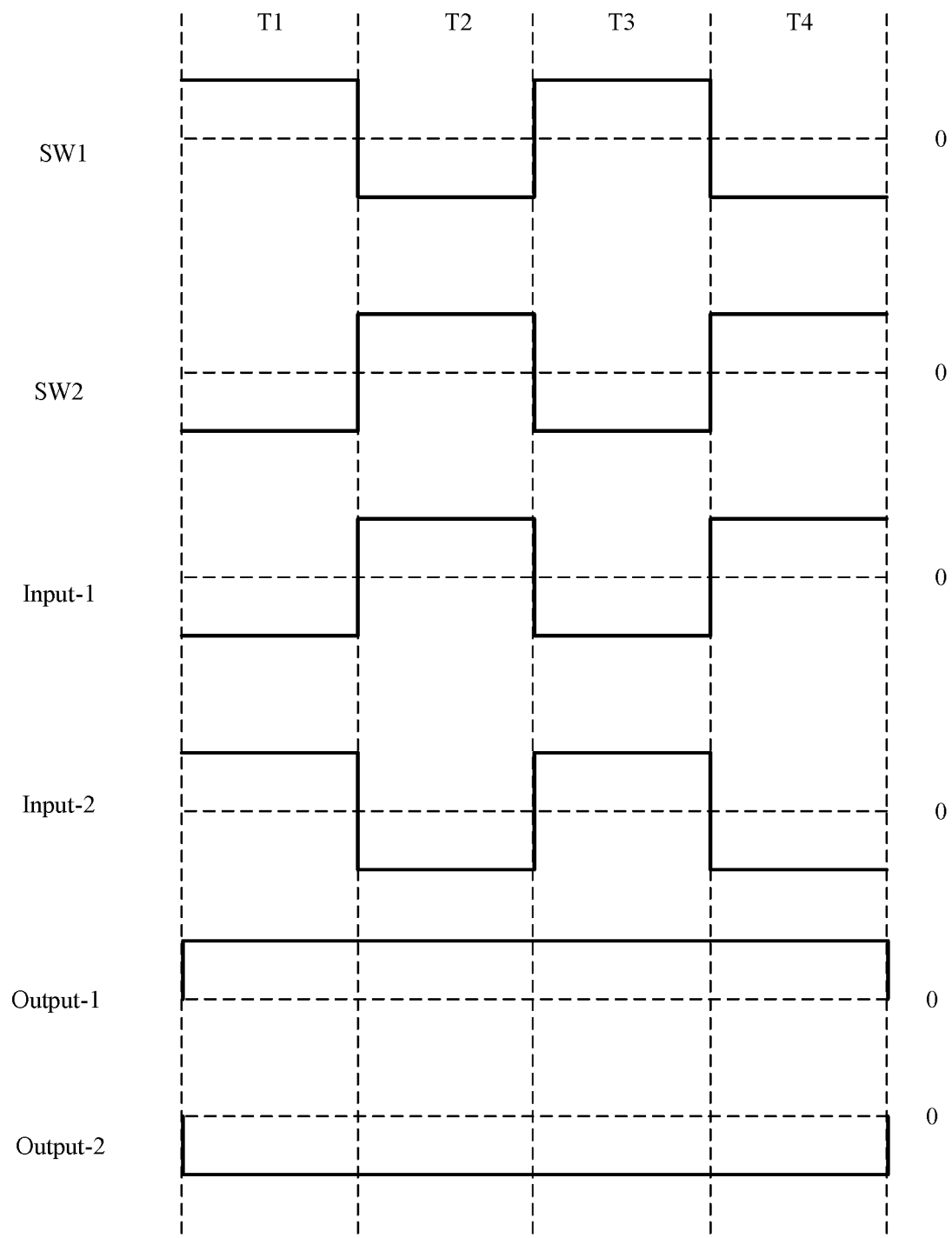
FIG. 30 is a time sequence diagram of an input/output signal at each terminal of the conversion circuit shown in FIG. 29.

FIG. 29 is a schematic diagram of a structure of a conversion circuit according to yet another embodiment of the present disclosure, and FIG. 30 is a time sequence diagram of an input/output signal at each terminal of the conversion circuit shown in FIG. 29.

With reference to FIG. 29, the first transistor, the second transistor, the third transistor, and the fourth transistor of the conversion circuit are respectively a PMOS transistor 291, a PMOS transistor 292, a PMOS transistor 293, and a PMOS transistor 294.

The conversion circuit includes a first switch signal input terminal 2971 and a second switch signal input terminal 2972. The first switch signal input terminal 2971 receives a first switch control signal, and the second switch signal input terminal 2972 receives a second switch control signal. The first switch control signal and the second switch control signal have opposite waveforms.

A gate electrode 2910 of the PMOS transistor 291 and a gate electrode 2930 of the PMOS transistor 293 are connected to the first switch signal input terminal 2971, and a gate electrode 2920 of the PMOS transistor 292 and a gate electrode 2940 of the PMOS transistor 294 are connected to the second switch signal input terminal 2972.

The first input terminal 2951 is connected to a first electrode 2911 of the PMOS transistor 291 and a first electrode 2921 of the PMOS transistor 292. The second input terminal 2952 is connected to a first electrode 2931 of the PMOS transistor 293 and a first electrode 2941 of the PMOS transistor 294.

The first output terminal 2961 is connected to a second electrode 2912 of the PMOS transistor 291 and a second electrode 2942 of the PMOS transistor 294. The second output terminal 2962 is connected to a second electrode 2922 of the PMOS transistor 292 and a second electrode 2932 of the PMOS transistor 293.

FIG. 30 is a time sequence diagram of signals at the first switch signal input terminal 2971, the second switch signal input terminal 2972, the first input terminal 2951, the second input terminal 2952, the first output terminal 2961 and the second output terminal 2962 of the conversion circuit shown in FIG. 29.

With reference to FIG. 29 and FIG. 30, during a period T1, the switch control signal received by the first switch signal input terminal 2971 is a high-level signal, and the switch control signal received by the second switch signal input terminal 2972 is a low-level signal. Therefore, the PMOS transistor 292 and the PMOS transistor 294 are turned on, and the PMOS transistor 291 and the PMOS transistor 293 are turned off. In this case, the first input terminal 2951 is in communication with the second output terminal 2962, and the second input terminal 2952 is in communication with the first output terminal 2962. Thus, the first output signal outputted from the first output terminal 2961 and the second input signal have a same polarity, and the second output signal outputted from the second output terminal 2962 and the first input signal have a same polarity. As shown in FIG. 30, during the period T1, the first input signal is a low-level signal and the second input signal is a high-level signal, and thus the first output signal has the same polarity as the second input signal and is a high-level signal, and the second output signal has the same polarity as the first input signal and is a low-level signal.

During a period T2, the switch control signal received by the first switch signal input terminal 2971 is a low-level signal, and the switch control signal received by the second switch signal input terminal 2972 is a high-level signal. Therefore, the PMOS transistor 292 and the PMOS transistor 294 are turned off, and the PMOS transistor 291 and the PMOS transistor 293 are turned on. In this case, the second input terminal 2952 is in communication with the second output terminal 2962, and the first input terminal 2951 is in communication with the first output terminal 2961. Thus, the first output signal outputted from the first output terminal 2961 and the first input signal have a same polarity, and the second output signal outputted from the second output terminal 2962 and the second input signal have a same polarity. As shown in FIG. 30, during the period T2, the first input signal is a high level signal and the second input signal is a low level signal, and thus the first output signal has the same polarity as the first input signal and is a high-level signal, and the second output signal has the same polarity as the second input signal and is a low-level signal.

Similarly, waveforms of signals of the first switch signal input terminal 2971, the second switch signal input terminal 2972, the first input terminal 2951, the second input terminal 2952, the first output terminal 2961, and the second output terminal 2962 during a period T3 are the same as those during the period T1. Therefore, during the period T3, the first output signal is a high-level signal, and the second output signal is a low-level signal.

Signal waveforms the first switch signal input terminal 2971, the second switch signal input terminal 2972, the first input terminal 2951, the second input terminal 2952, the first output terminal 2961, and the second output terminal 2962 during a period T4 are the same as those during the period T2. Therefore, during the period T4, the first output signal is a high-level signal, and the second output signal is a low-level signal.

It can be seen that during the periods T1-T4, although polarities of the first input signal and the second input signal received by the first input terminal 2951 and the second input terminal 2952 are different and alternately switch, each of the first output signal and the second output signal outputted from the first output terminal 2961 and the second output terminal 2962 has a constant polarity during any period. In this embodiment, the first output signal is always a high-level signal, and the second output signal is always a low-level signal.

In other embodiments, the first transistor, the second transistor, the third transistor, and the fourth transistor of the conversion circuit may be all NMOS transistors, and the NMOS transistor is turned on at a high-level signal. Those skilled in the art may, based on the conversion circuit according shown in FIG. 29 and the time sequence diagram of an input/output signal at each terminal of the conversion circuit shown in FIG. 30, correspondingly obtain an embodiment of all NMOS transistors, and details are not further described herein.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A conversion circuit, comprising:
   at least one switch signal input terminal;
   a first input terminal;
   a second input terminal;
   a first output terminal; and
   a second output terminal,
   wherein the at least one switch signal input terminal receives a switch control signal;
   the first input terminal and the second input terminal respectively receive a first input signal and a second input signal, and a polarity of the first input signal and a polarity of the second input signal are different and alternately switch; and
   depending on the switch control signal, the first input terminal is in communication with the first output terminal and the second input terminal is in communication with the second output terminal, or the second input terminal is in communication with the first output terminal and the first input terminal is in communication with the second output terminal, so that a first output signal outputted from the first output terminal has a consistent polarity at any time and a second output signal outputted from the second output terminal has a consistent polarity at any time.

2. The conversion circuit according to claim 1, further comprising:
   a first transistor;
   a second transistor;
   a third transistor; and
   a fourth transistor,
   wherein the first transistor and the third transistor are transistors of one type, and the second transistor and the fourth transistor are transistors of another type;
   wherein a gate electrode of the first transistor, a gate electrode of the second transistor, a gate electrode of the third transistor and a gate electrode of the fourth transistor are respectively connected to the at least one switch signal input terminal;
   wherein the first input terminal is connected to a first electrode of the first transistor and a first electrode of the second transistor;
   wherein the second input terminal is connected to a first electrode of the third transistor and a first electrode of the fourth transistor;
   wherein the first output terminal is connected to a second electrode of the first transistor and a second electrode of the fourth transistor; and
   wherein the second output terminal is connected to a second electrode of the second transistor and a second electrode of the third transistor.

3. The conversion circuit according to claim 2, wherein the first transistor is an NMOS transistor, the second transistor is a PMOS transistor, the third transistor is an NMOS transistor, and the fourth transistor is a PMOS transistor; or the first transistor is a PMOS transistor, the second transistor is an NMOS transistor, the third transistor is a PMOS transistor, and the fourth transistor is an NMOS transistor.

4. The conversion circuit according to claim 2, wherein, when the switch control signal received by the at least one switch signal input terminal turns on the first transistor and the third transistor and turns off the second transistor and the fourth transistor, the first input terminal is in communication with the first output terminal, and the second input terminal is in communication with the second output terminal, so that the first output signal outputted from the first output terminal and the first input signal have a same polarity, and the second output signal outputted from the second output terminal and the second input signal have a same polarity; or when the switch control signal received by the at least one switch signal input terminal turns off the first transistor and the third transistor and turns on the second transistor and the fourth transistor, the second input terminal is in communication with the first output terminal, and the first input terminal is in communication with the second output terminal, so that the first output signal outputted from the first output terminal and the second input signal have a same polarity, and the second output signal outputted from the second output terminal and the first input signal have a same polarity.

5. The conversion circuit according to claim 1, further comprising:
a first transistor,
a second transistor,
a third transistor, and
a fourth transistor,
wherein the first transistor and the third transistor are transistors of one type, and the second transistor and the fourth transistor are transistors of another type;
wherein a gate electrode of the first transistor, a gate electrode of the second transistor, a gate electrode of the third transistor and a gate electrode of the fourth transistor are respectively connected to the at least one switch signal input terminal;
wherein the first input terminal is connected to a first electrode of the first transistor and a first electrode of the second transistor;
wherein the second input terminal is connected to a first electrode of the third transistor and a first electrode of the fourth transistor;
wherein the first output terminal is connected to a second electrode of the first transistor and a second electrode of the third transistor; and
wherein the second output terminal is connected to a second electrode of the second transistor and a second electrode of the fourth transistor.

6. The conversion circuit according to claim 5, wherein when the switch control signal received by the at least one switch signal input terminal turns on the first transistor and the fourth transistor and turns off the second transistor and the third transistor, the first input terminal is in communication with the first output terminal, and the second input terminal is in communication with the second output terminal, so that the first output signal outputted from the first output terminal and the first input signal have a same polarity, and the second output signal outputted from the second output terminal and the second input signal have a same polarity; or when the switch control signal received by the at least one switch signal input terminal turns off the first transistor and the fourth transistor and turns on the second transistor and the third transistor, the second input terminal is in communication with the first output terminal, and the first input terminal is in communication with the second output terminal, so that the first output signal outputted from the first output terminal and the second input signal have a same polarity, and the second output signal outputted from the second output terminal and the first input signal have a same polarity; wherein the first input signal is at a high level, and the second input signal is at a low level.

7. The conversion circuit according to claim 1, further comprising:
a first transistor;
a second transistor;
a third transistor; and
a fourth transistor,
wherein the first transistor and the fourth transistor are transistors of one type, and the second transistor and the third transistor are transistors of another type;
wherein a gate electrode of the first transistor, a gate electrode of the second transistor, a gate electrode of the third transistor and a gate electrode of the fourth transistor are respectively connected to the at least one switch signal input terminal;
wherein the first input terminal is connected to a first electrode of the first transistor and a first electrode of the second transistor;
wherein the second input terminal is connected to a first electrode of the third transistor and a first electrode of the fourth transistor;
wherein the first output terminal is connected to a second electrode of the first transistor and a second electrode of the fourth transistor; and
wherein the second output terminal is connected to a second electrode of the second transistor and a second electrode of the third transistor.

8. The conversion circuit according to claim 7, wherein the at least one switch signal input terminal comprises a first switch signal input terminal and a second switch signal input terminal, the first switch signal input terminal receives a first switch control signal, and the second switch signal input terminal receives a second switch control signal; wherein the first switch control signal and the second switch control signal have opposite waveforms; and wherein the gate electrode of the first transistor and the gate electrode of the second transistor are connected to the first switch signal input terminal, and the gate electrode of the third transistor and the gate electrode of the fourth transistor are connected to the second switch signal input terminal.

9. The conversion circuit according to claim 7, further comprising a first waveform converter; wherein the first waveform converter has one terminal connected to the at least one switch signal input terminal, and another terminal connected to the gate electrode of the third transistor and the gate electrode of the fourth transistor; and wherein the first waveform converter is configured to invert a level of the switch control signal received by the at least one switch signal input terminal and then transmit the inverted level to the gate electrode of third transistor and the gate electrode of the fourth transistor.

10. The conversion circuit according to claim 7, wherein the first transistor is an NMOS transistor, the second transistor is a PMOS transistor, the third transistor is a PMOS transistor, and the fourth transistor is an NMOS transistor; or the first transistor is a PMOS transistor, the second transistor is an NMOS transistor, the third transistor is an NMOS transistor, and the fourth transistor is a PMOS transistor.

11. The conversion circuit according to claim 7, wherein when the switch control signal received by the at least one switch signal input terminal turns on the first transistor and the third transistor and turns off the second transistor and the fourth transistor, the first input terminal is in communication with the first output terminal, and the second input terminal is in communication with the second output terminal, so that the first output signal outputted from the first output terminal and the first input signal have a same polarity, and the second output signal outputted from the second output terminal and the second input signal have a same polarity; or when the switch control signal received by the at least one switch signal input terminal turns off the first transistor and the third transistor and turns on the second transistor and the fourth transistor, the second input terminal is in communication with the first output terminal, and the first input terminal is in communication with the second output terminal, so that the first output signal outputted from the first output terminal and the second input signal have a same polarity, and the second output signal outputted from the second output terminal and the first input signal have a same polarity.

12. The conversion circuit according to claim 1, wherein the first input signal is at a high level and the second input signal is at a low level; or the first input signal is at the low level and the second input signal is at the high level.

13. The conversion circuit according to claim 1, further comprising a first transistor,
wherein the first transistor comprises a gate electrode connected to the at least one switch signal input terminal and a first electrode connected to the first input terminal, and
wherein the gate electrode of the first transistor inputs a turn-on level, and the first input signal has a polarity opposite to a polarity of the turn-on level.

14. A display panel, comprising the conversion circuit according to claim 1 provided in a non-display area of the display panel.

15. The display panel according to claim 14, further comprising a shift register circuit provided in the non-display area of the display panel;
wherein the first output terminal and the second output terminal of the conversion circuit are respectively connected to the shift register circuit, so as to provide the first input signal and the second input signal to the shift register circuit.

16. A display device, comprising the display panel according to claim 14 and a flexible circuit board, wherein the display panel is electrically connected to the flexible circuit board;
wherein a driving chip is bound on the flexible circuit board, and the driving chip is configured to output the first input signal to the first input terminal and the second input signal to the second input terminal respectively through adjacent signal lines, and to output a switch control signal to the at least one switch signal input terminal of the conversion circuit.

* * * * *